US012792814B2

(12) United States Patent
Park et al.

(10) Patent No.: US 12,792,814 B2
(45) Date of Patent: Nov. 10, 2026

(54) INTEGRATED CIRCUIT LAYOUT AND METHOD FOR MANUFACTURING INTEGRATED CIRCUIT DEVICE USING THE INTEGRATED CIRCUIT LAYOUT

(71) Applicant: SAMSUNG ELECTRONICS CO., LTD., Suwon-si (KR)

(72) Inventors: Hyung Keun Park, Suwon-si (KR); Myung Soo Noh, Suwon-si (KR); Da Woon Choi, Suwon-si (KR); Bong Keun Kim, Suwon-si (KR); Yun Kyoung Song, Suwon-si (KR); Hee Jeong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 263 days.

(21) Appl. No.: 18/400,463

(22) Filed: Dec. 29, 2023

(65) Prior Publication Data

US 2024/0370619 A1 Nov. 7, 2024

(30) Foreign Application Priority Data

May 2, 2023 (KR) ........................ 10-2023-0056823

(51) Int. Cl.

*H10W 46/00* (2026.01)
*G06F 30/392* (2020.01)
*H10W 90/00* (2026.01)

(52) U.S. Cl.

CPC .......... *G06F 30/392* (2020.01); *H10W 46/00* (2026.01); *H10W 46/301* (2026.01)

(58) Field of Classification Search

CPC . H10W 46/00; H10W 46/101; H10W 46/301; H10W 46/501; H10W 46/503; H10W 90/00; H10D 89/10; H10D 84/0126; H10D 84/038; G06F 30/392; G06F 30/398; G06F 30/39

See application file for complete search history.

(56) References Cited

U.S. PATENT DOCUMENTS 7,757,195 B2 7/2010 Smith
9,275,831 B2 3/2016 Arjavac
9,576,772 B1 2/2017 Arjavac
(Continued)

FOREIGN PATENT DOCUMENTS

KR 10-2009-0044527 5/2009

*Primary Examiner* — Omar F Mojaddedi
(74) *Attorney, Agent, or Firm* — MORGAN, LEWIS & BOCKIUS LLP

(57) ABSTRACT

An integrated circuit layout includes: a first chip area; and a second chip area, wherein the first chip area includes: a first main area including a first main pattern; a first mark area adjacent to the first main area, wherein a first mark pattern is formed in the first mark area; and a first dummy area including a first dummy pattern, wherein the second chip area includes: a second main area including a second main pattern; a second mark area adjacent to the second main area, wherein a second mark pattern is formed in the second mark area; and a second dummy area including a second dummy pattern, wherein the first and second mark patterns are used to check alignment states of the first chip area and the second chip area, respectively, and wherein each of the first and second mark patterns has a standard cell structure.

15 Claims, 20 Drawing Sheets

(56) References Cited

U.S. PATENT DOCUMENTS

| | | | | |
|---|---|---|---|---|
| 9,633,161 | B2 | 4/2017 | Baek | |
| 9,934,939 | B2 | 4/2018 | Kim | |
| 10,082,470 | B2 | 9/2018 | Shortt | |
| 10,283,496 | B2 | 5/2019 | Lo | |
| 12,328,107 | B2 * | 6/2025 | Kim | H03F 1/0288 |
| 2007/0099097 | A1 | 5/2007 | Kang | |
| 2019/0109086 | A1 * | 4/2019 | Li | H10W 20/42 |
| 2023/0402335 | A1 * | 12/2023 | Huang | H10W 42/00 |
| 2024/0038719 | A1 * | 2/2024 | Lan | H10P 14/3211 |
| 2024/0069447 | A1 * | 2/2024 | Selvanathan | G03F 7/70466 |

* cited by examiner

INTEGRATED CIRCUIT LAYOUT AND METHOD FOR MANUFACTURING INTEGRATED CIRCUIT DEVICE USING THE INTEGRATED CIRCUIT LAYOUT

CROSS-REFERENCE TO RELATED APPLICATION

This application claims priority under 35 USC § 119 to Korean Patent Application No. 10-2023-0056823 filed on May 2, 2023 in the Korean Intellectual Property Office, the disclosure of which is incorporated by reference herein in its entirety.

TECHNICAL FIELD

The present inventive concept relates to an integrated circuit layout and a method for manufacturing an integrated circuit device using the integrated circuit layout.

DISCUSSION OF THE RELATED ART

As semiconductor process technology advances, a size of a transistor is increasingly becoming smaller and smaller. Accordingly, a larger number of transistors are being integrated into a semiconductor device. For example, a system-on-chip (SOC) as an integrated circuit (IC) in which all components of a computer or another electronic system are integrated into a single chip is widely used in various applications. As performance of an application increases, a semiconductor device including a larger number of components increasingly becomes more desirable.

Further, as a size of a transistor that is integrated into the semiconductor device becomes smaller and smaller, difficulty of a process of manufacturing the semiconductor device may increase. For example, a marker used in manufacturing a mask may violate a product design rule. Thus, a risk between layers might not be detected in a DRC (design rule check) at a layout stage. Therefore, it may be difficult to identify a risk of the process. Accordingly, a safer marker is desirable.

SUMMARY

According to some embodiments of the present inventive concept, an integrated circuit layout includes: a first chip area; and a second chip area adjacent to the first chip area, wherein the first chip area includes: a first main area in which a first main pattern is formed; a first mark area adjacent to the first main area, wherein a first mark pattern is formed in the first mark area; and a first dummy area in which a first dummy pattern is formed, wherein the first dummy area is outside of the first main area and the first mark area, wherein the second chip area includes: a second main area in which a second main pattern is formed; a second mark area adjacent to the second main area, wherein a second mark pattern is formed in the second mark area; and a second dummy area in which a second dummy pattern is formed, wherein the second dummy area is outside of the second main area and the second mark area, wherein the first and second mark patterns are used to check alignment states of the first chip area and the second chip area, respectively, and wherein each of the first and second mark patterns has a standard cell structure.

According to some embodiments of the present inventive concept, an integrated circuit layout includes: a first layer; and a second layer disposed on the first layer, wherein the first layer includes: at least one first main area, wherein a first main pattern is formed in each of the at least one first main area; and at least one first mark area adjacent to the at least one first main area, wherein a first mark pattern is for checking an alignment state of the first main area and is formed in each of the at least one first mark area, wherein the second layer includes: at least one second main area, wherein a second main pattern is formed in each of the at least one second main area; and at least one second mark area adjacent to the at least one second main area, wherein a second mark pattern is for checking an alignment state of the second main area and is formed in each of the at least one second mark area, wherein the first main area and the second main area overlap each other, wherein the first mark area and the second mark area overlap each other, and wherein each of the first and second mark patterns has a standard cell structure.

According to some embodiments of the present inventive concept, a method for manufacturing an integrated circuit device includes: forming a first pattern using a first layer; and forming a second pattern on the first pattern by using a second layer, wherein the first layer includes: a first main area in which a first pattern is formed; and a first mark area adjacent to the first main area, wherein a first mark pattern is for checking an alignment state of the first pattern and is formed in the first mark area, wherein the second layer includes: a second main area in which a second pattern is formed; and a second mark area adjacent to the second main area, wherein a second mark pattern is for checking an alignment state of the second pattern and is formed in the second mark area, wherein the first main area and the second main area overlap each other, wherein the first mark area and the second mark area overlap each other, and wherein each of the first and second mark patterns has a standard cell structure.

BRIEF DESCRIPTION OF DRAWINGS

The above and features of the present inventive concept will become more apparent by describing in detail example embodiments thereof with reference to the attached drawings, in which.

DETAILED DESCRIPTIONS OF THE EMBODIMENTS

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described under could be termed a second element, component, region, layer or section, without departing from the spirit, idea, and scope of the present inventive concept.

Hereinafter, embodiments of the present inventive concept will be described with reference to the accompanying drawings.

Figure 1:
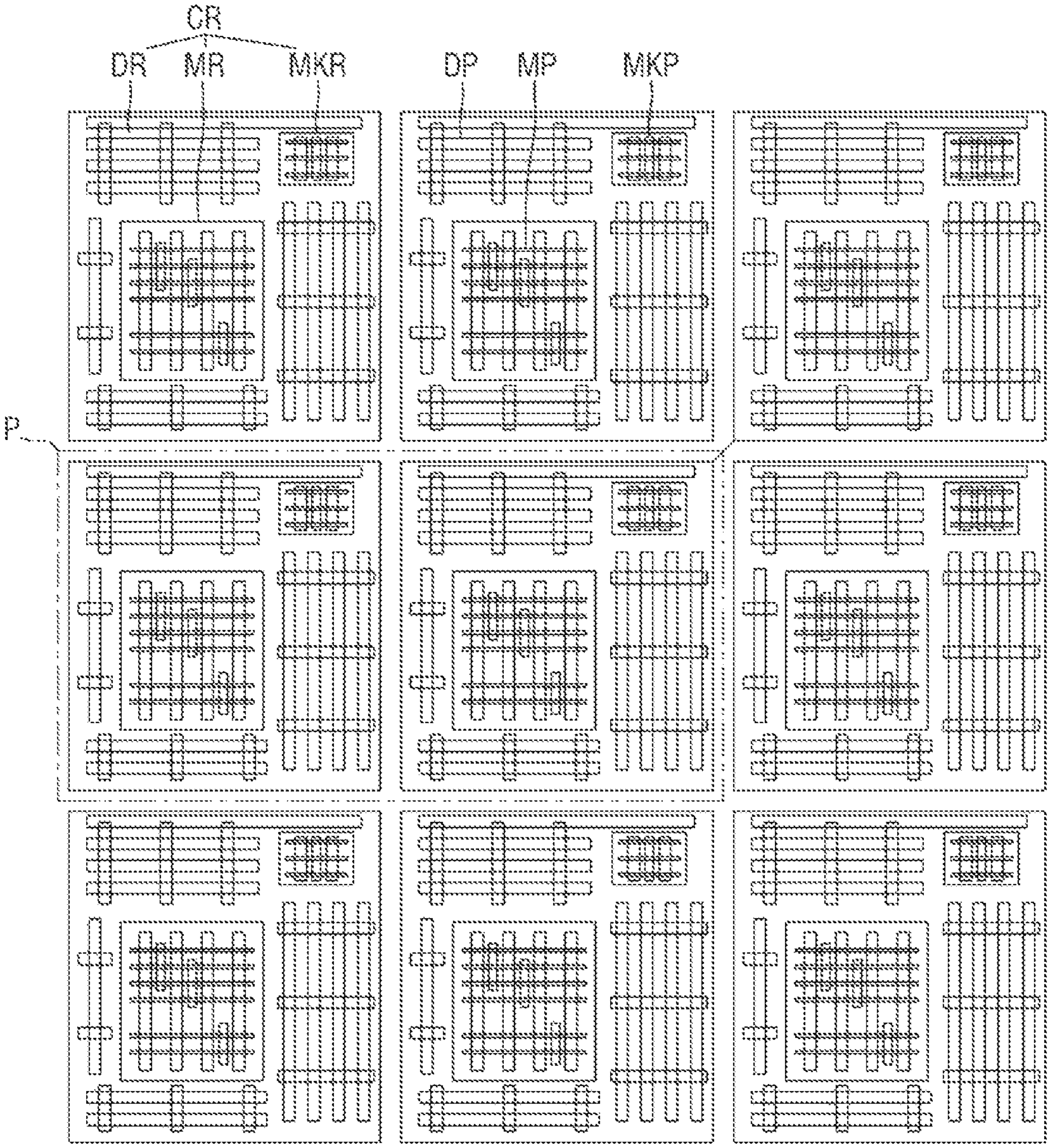
FIG. 1 is a layout diagram illustrating an integrated circuit layout according to some embodiments of the present inventive concept.

FIG. 1 is a layout diagram illustrating an integrated circuit layout according to some embodiments of the present inventive concept.

Referring to FIG. 1, an integrated circuit layout according to some embodiments of the present inventive concept may include a plurality of chip areas CR. The plurality of chip areas CR may be arranged with a predetermined interval. Each of the plurality of chip areas CR may include a dummy area DR, a main area MR, and a mark area MKR.

The main area MR may be an area of each chip area CR in which main patterns MP are formed.

The main patterns MP may be components of a working transistor. For example, when the integrated circuit device formed in the chip area CR is a logic device, the main patterns MP may include, but are not limited to, a gate electrode, a source/drain pattern, a fin pattern, an active contact, a gate contact, and/or a via contact of a transistor. When the integrated circuit device formed in the chip area CR is a DRAM, the main patterns MP may include a word line, a bit line, a plurality of contacts, and/or a capacitor. When the integrated circuit device formed in the chip area CR is a flash memory, the main patterns MP may include a word line, a bit line, and/or a plurality of channel holes.

The mark area MKR may be disposed adjacent to the main area MR. The mark area MKR may be surrounded with the dummy area DR. The mark area MKR may be an area of each chip area CR in which mark patterns MKP are formed. The mark patterns MKP are not components of a working transistor. An alignment state of each chip area CR may be checked by using the mark patterns MKP. In addition, the alignment state of the main patterns MP may be checked by using the mark patterns MKP.

In some embodiments of the present inventive concept, each of the mark patterns MKP may have a standard cell structure.

A standard cell may be a unit of a layout included in an integrated circuit, may be designed to perform a predefined function, and may be referred to as a cell. The standard cells may be pre-designed according to manufacturing technology and then may be stored in a standard cell library. The integrated circuit may be designed by arranging and interconnecting the standard cells stored in the standard cell library according to a design rule. For example, the standard cell may include a basic circuit that is often used in design of a digital circuit for an electronic device such as a design of a central processing unit (CPU), a graphics processing unit (GPU), and a system-on-chip (SOC), such as an inverter, an AND gate, a NAND gate, an OR gate, an XOR gate, and a NOR gate. In addition, the standard cell may include another circuit frequently used in a circuit block, such as a flip-flop and a latch.

The mark patterns MKP having the cell structure may mean that a design rule of the mark patterns MKP complies with a design rule of the standard cell. Since the design rule of the mark patterns MKP complies with the design rule of the standard cell, reliability of the integrated circuit device manufactured using the integrated circuit layout may be increased.

In addition, in some embodiments of the present inventive concept, the design rule of the mark patterns MKP may comply with a design rule of the main patterns MP.

The design rule refers to several parameters provided by an integrated circuit manufacturer. Under the design rule, an integrated circuit designer may verify accuracy of a photo mask set to be manufactured using the integrated circuit layout.

The design rule may include, for example, a ground rule and a special structure. In this regard, the special structure means a structure to which a margin is applied more strictly than the margin is applied to the ground rule. For example, the special structure is also a kind of the design rule.

The design rule may include, for example, a width rule, a minimum area rule, a space rule, an enclosure rule, a symmetry rule, an alignment rule, and the like.

The dummy area DR may be an area of each chip area CR in which dummy patterns DP are formed. The dummy area DR may be an area other than the main area MR and the mark area MKR that are in the chip area CR. The dummy patterns DP are not components of a working transistor.

Figure 2:
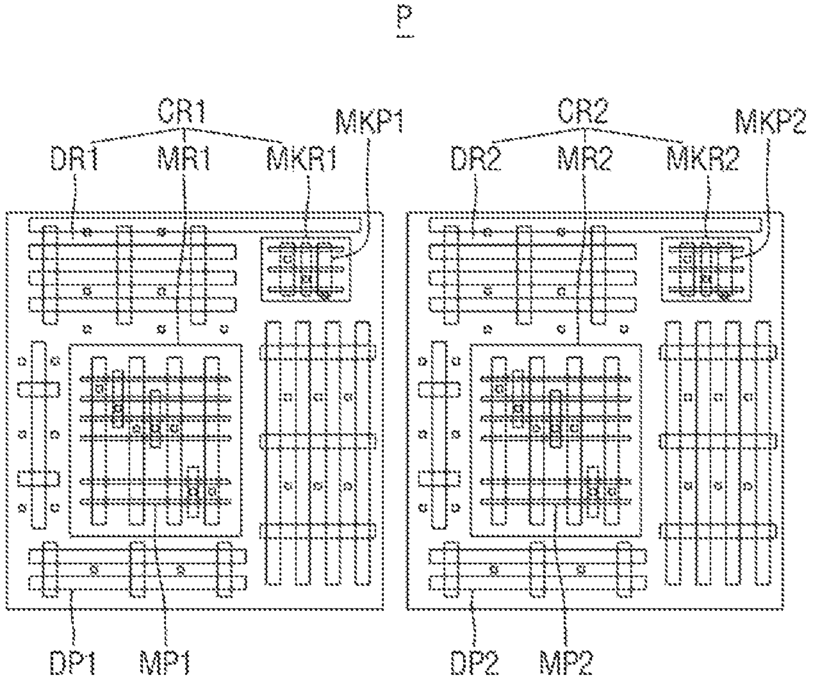
FIG. 2 is an enlarged view of a P area in FIG. 1.

FIG. 2 is an enlarged view of a P area in FIG. 1. FIG. 2 is an enlarged view to illustrate the chip area of FIG. 1.

Referring to FIG. 2, a first chip area CR1 and a second chip area CR2 are provided. The first chip area CR1 and the second chip area CR2 may be adjacent to each other.

The first chip area CR1 may include a first main area MR1, a first mark area MKR1, and a first dummy area DR1. The first main area MR1 may be an area of the first chip area CR1 in which first main patterns MP1 are formed. The first main patterns MP1 may be components of a working transistor.

The first mark area MKR1 may be disposed adjacent to the first main area MR1. The first mark area MKR1 may be at least partially surrounded with the first dummy area DR1. The first mark area MKR1 may be an area of the first chip area CR1 in which first mark patterns MKP1 are formed. The first mark patterns MKP1 are not components of a working transistor.

The first dummy area DR1 may be an area of the first chip area CR1 in which first dummy patterns DP1 are formed. The first dummy area DR1 may be an area other than the first main area MR1 and the first mark area MKR1 in the first chip area CR1. The first dummy patterns DP1 are not components of a working transistor.

The second chip area CR2 may include a second main area MR2, a second mark area MKR2, and a second dummy area DR2. The second main area MR2 may be an area of the second chip area CR2 in which second main patterns MP2 are formed. The second main patterns MP2 may be components of a working transistor.

The second mark area MKR2 may be disposed adjacent to the second main area MR2. The second mark area MKR2 may be at least partially surrounded by the second dummy area DR2. The second mark area MKR2 may be an area of the second chip area CR2 in which second mark patterns MKP2 are formed. The second mark patterns MKP2 are not components of a working transistor.

The second dummy area DR2 may be an area of the second chip area CR2 in which second dummy patterns DP2 are formed. The second dummy area DR2 may be an area other than the second main area MR2 and the second mark area MKR2 in the second chip area CR2. The second dummy patterns DP2 are not components of a working transistor.

In some embodiments of the present inventive concept, a relative position of the first mark area MKR1 to the first main area MR1 is the same as a relative position of the second mark area MKR2 to the second main area MR2. For example, a position of the first main area MR1 within the first chip area CR1 is identical to a position of the second main area MR2 within the second chip area CR2. In addition, a position of the first mark area MKR1 within the first chip area CR1 is identical to a position of the second mark area MKR2 within the second chip area CR2.

In other words, it is assumed that when a coordinate of a center of the first main area MR1 in the first chip area CR1 is (0, 0), a coordinate of a center of the first mark area MKR1 in the first chip area CR1 is (a and b). In this case, when a coordinate of a center of the second main area MR2 in the second chip area CR2 is (0, 0), a coordinate of a center of the second mark area MKR2 in the second chip area CR2 may be (a, b).

In some embodiments of the present inventive concept, each of the first mark pattern MKP1 and the second mark pattern MKP2 may have a standard cell structure. Each of the first main pattern MP1 and the second main pattern MP2 may have a standard cell structure. Therefore, a design rule of the first mark pattern MKP1 complies with a design rule of the first main pattern MP1. In addition, a design rule of the second mark pattern MKP2 complies with a design rule of the second main pattern MP2.

In some embodiments of the present invention, the first mark pattern MKP1 and the second mark pattern MKP2 may be used to respectively check alignment states of the first chip area CR1 and the second chip area CR2. For example, when a plurality of chip areas are arranged, the first mark pattern MKP1 and the second mark pattern MKP2 may respectively define the first chip area CR1 and the second chip area CR2. In addition, the first mark pattern MKP1 and the second mark pattern MKP2 may be used to respectively check alignment states of the first main pattern MP1 and the second main pattern MP2. However, the present inventive concept is not limited thereto.

Figure 3:
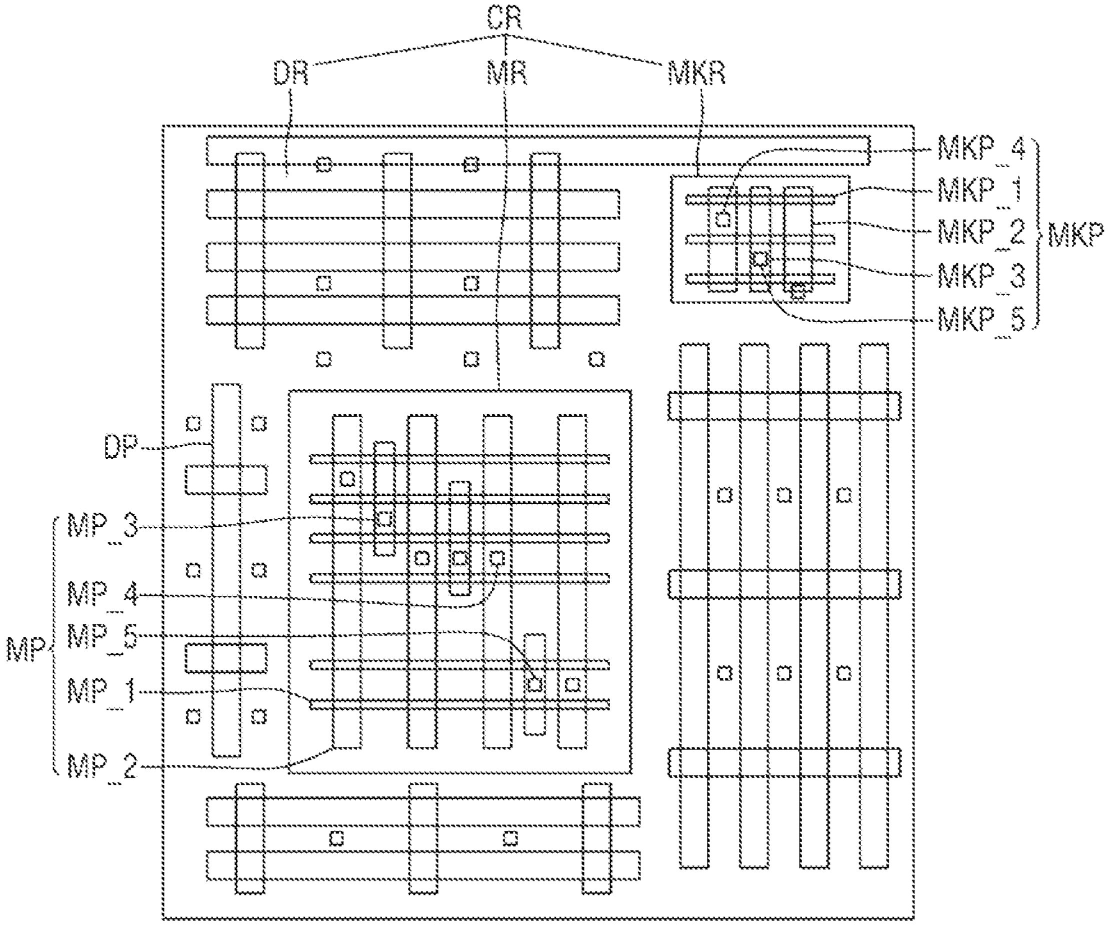
FIG. 3 is a diagram illustrating a chip area according to some embodiments of the present inventive concept.
Figure 4:
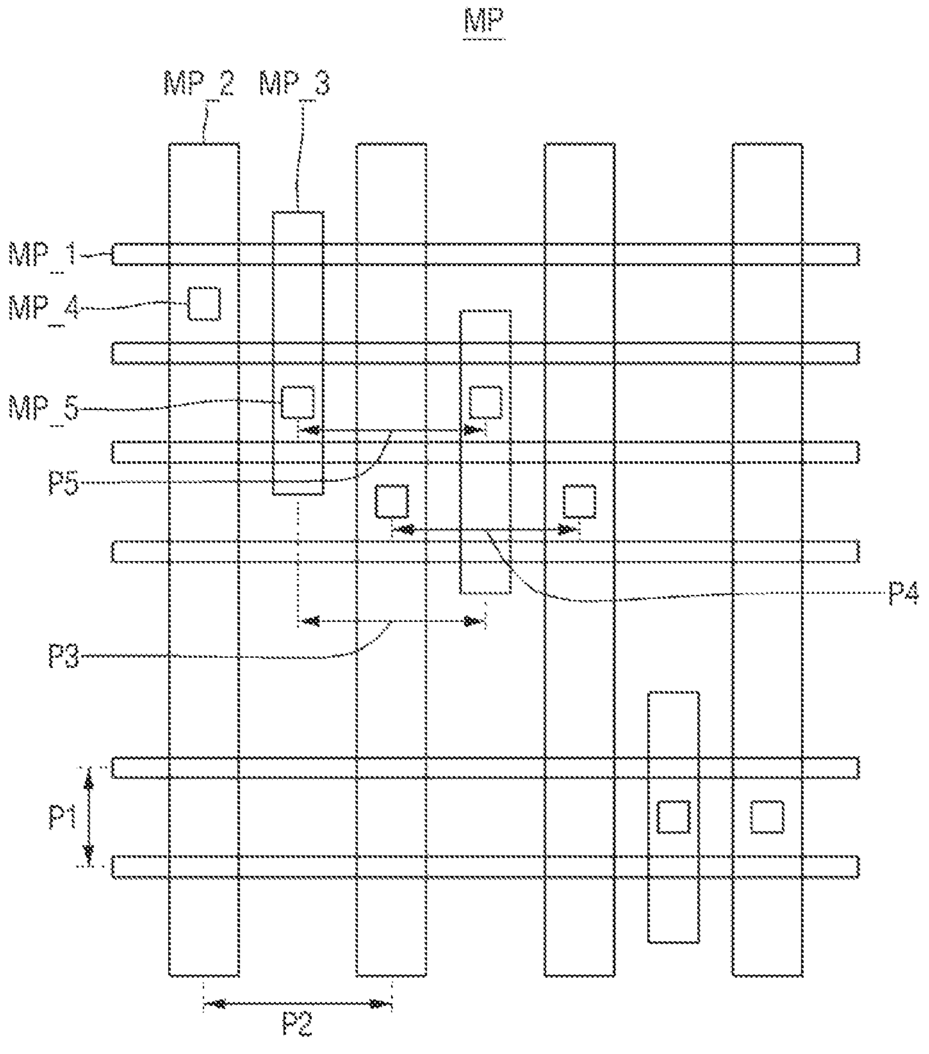
FIG. 4 is a diagram illustrating a main pattern according to some embodiments of the present inventive concept.
Figure 5:
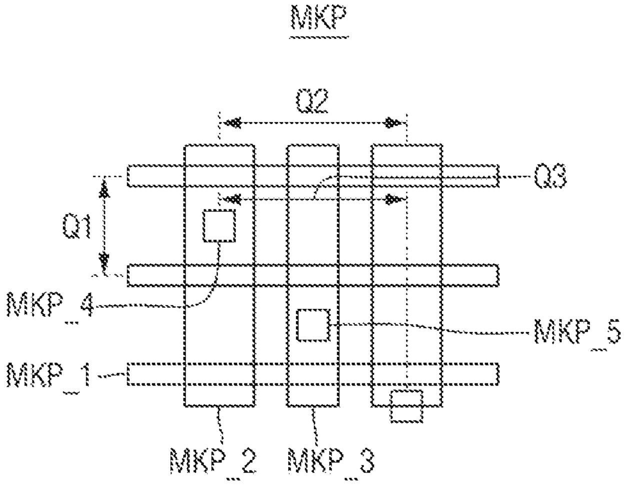
FIG. 5 is a diagram illustrating a mark pattern according to some embodiments of the present inventive concept.

FIG. 3 is a diagram illustrating a chip area according to some embodiments of the present inventive concept. FIG. 4 is a diagram illustrating a main pattern according to some embodiments of the present inventive concept. FIG. 5 is a diagram illustrating a mark pattern according to some embodiments of the present inventive concept. Using FIG. 3 to FIG. 5, mark patterns and main patterns are described in more detail.

Referring to FIGS. 3 to 5, the main patterns MP may include a plurality of first sub-main patterns MP_1, a plurality of second sub-main patterns MP_2, a plurality of third sub-main patterns MP_3, a plurality of fourth sub-main patterns MP_3, and a plurality of fifth sub-main patterns MP_5.

In FIG. 4, the plurality of first sub-main patterns MP_1 may extend in one direction (for example, in a longitudinal direction). The plurality of first sub-main patterns MP_1 may have a first pitch P1. As used herein, the term "pitch" may be a parameter of the design rule. For example, the pitch may be a width rule, a minimum area rule, a space rule, an enclosure rule, a symmetry rule, an arrangement rule, and the like of patterns.

In one example, the pitch may be an arrangement rule of the patterns. For example, in FIG. 4, the plurality of first sub-main patterns MP_1 may be spaced apart from each other by the first pitch P1. The first pitch P1 may be a distance from a center of one first sub-main pattern MP_1 to a center of another first sub-main pattern MP_1 adjacent thereto. In another example, the pitch may be a width rule. In this case, the first pitch P1 may be a width of the first sub-main patterns MP_1.

The plurality of second sub-main patterns MP_2 may extend in one direction (for example, in a transverse direction). The plurality of second sub-main patterns MP_2 may intersect with the plurality of first sub-main patterns MP_1. The plurality of second sub-main patterns MP_2 may have a second pitch P2. For example, the plurality of second sub-main patterns MP_2 may be spaced apart from each other by the second pitch P2. The second pitch P2 may be a distance from a center of one second sub-main pattern MP_2 to a center of another second sub-main pattern MP_2 adjacent thereto. In another embodiment, the second pitch P2 may be a width of each of the second sub-main patterns MP_2.

Each of the plurality of third sub-main patterns MP_3 may be disposed between adjacent ones of the second sub-main patterns MP_2. The plurality of third sub-main patterns MP_3 may intersect with the plurality of first sub-main patterns MP_1. The plurality of third sub-main patterns MP_3 may have a third pitch P3. For example, the plurality of third sub-main patterns MP_3 may be spaced apart from each other by the third pitch P3. The third pitch P3 may be a distance from a center of one third sub-main pattern MP_3 to a center of another the third sub-main pattern MP_3 adjacent thereto. In another embodiment, the third pitch P3 may be a width of each of the third sub-main patterns MP_3.

Each of the plurality of fourth sub-main patterns MP_4 may be disposed on each of the second sub-main patterns MP_2. The plurality of fourth sub-main patterns MP_4 may have a fourth pitch P4. For example, the plurality of fourth sub-main patterns MP_4 may be spaced apart from each other by the fourth pitch P4. The fourth pitch P4 may be a distance from a center of one fourth sub-main pattern MP_4 to a center of another fourth sub-main pattern MP_4 adjacent thereto.

Each of the plurality of fifth sub-main patterns MP_5 may be disposed on each of the third sub-main patterns MP_3. The plurality of fifth sub-main patterns MP_5 may have a fifth pitch P5. For example, the plurality of fifth sub-main patterns MP_5 may be spaced apart from each other by the fifth pitch P5. The fifth pitch P5 may be a distance from a center of one fifth sub-main pattern MP_5 to a center of another fifth sub-main pattern MP_5 adjacent thereto.

The mark patterns MKP may include a plurality of first sub-mark patterns MKP_1, a plurality of second sub-mark patterns MKP_2, a third sub-mark pattern MKP_3, a plurality of fourth sub-mark patterns MKP_4, and a fifth sub-mark pattern MKP_5.

In FIG. 5, the plurality of first sub-mark patterns MKP_1 may extend in one direction, (for example, in a longitudinal direction). The plurality of first sub-mark patterns MKP_1 may have a sixth pitch Q1. For example, the plurality of first sub-mark patterns MKP_1 may be spaced apart from each other by the sixth pitch Q1. The sixth pitch Q1 may be a distance from a center of one first sub-mark pattern MKP_1 to a center of another first sub-mark pattern MKP_1 adjacent thereto. In an embodiment of the present inventive concept, the sixth pitch Q1 may be a width of each of the first sub-mark patterns MKP_1.

The plurality of second sub-mark patterns MKP_2 may extend in one direction (for example, in a transverse direction). The plurality of second sub-mark patterns MKP_2 may intersect with the plurality of first sub-mark patterns MKP_1. The plurality of second sub-mark patterns MKP_2 may have a seventh pitch Q2. For example, the plurality of second sub-mark patterns MKP_2 may be spaced apart from each other by the seventh pitch Q2. The seventh pitch Q2 may be a distance from a center of one second sub-mark pattern MKP_2 to a center of another second sub-mark pattern MKP_2 adjacent thereto. In an embodiment of the present inventive concept, the seventh pitch Q2 may be a width of each of the second sub-mark patterns MKP_2.

The third sub-mark pattern MKP_3 may be disposed between the second sub-mark patterns MKP_2. The third sub-mark pattern MKP_3 may intersect with the plurality of first sub-mark patterns MKP_1. The third sub-mark pattern MKP_3 may have an eighth pitch.

Each of the plurality of fourth sub-mark patterns MKP_4 may be disposed on each of the second sub-mark patterns MKP_2. The plurality of fourth sub-mark patterns MKP_4 may have a ninth pitch Q3. For example, the plurality of fourth sub-mark patterns MKP_4 may be spaced apart from each other by the ninth pitch Q3. The ninth pitch Q3 may be a distance from a center of one fourth sub-mark pattern MKP_4 to a center of another fourth sub-mark pattern MKP_4 adjacent thereto.

The fifth sub-mark pattern MKP_5 may be disposed on the third sub-mark pattern MKP_3. The fifth sub-mark pattern MKP_5 may have a tenth pitch.

In some embodiments of the present inventive concept, the first pitch P1 may be equal or substantially equal to the sixth pitch Q1. The second pitch P2 may be equal or substantially equal to the seventh pitch Q2. The third pitch P3 may be equal or substantially equal to the eighth pitch. The fourth pitch P4 may be equal or substantially equal to the ninth pitch Q3. The fifth pitch P5 may be equal or substantially equal to the tenth pitch.

As described above, each of the main patterns MP and the mark patterns MKP may have the standard cell structure. Moreover, the design rule of the mark patterns MKP complies with the design rule of the main patterns MP.

Accordingly, the first pitch P1 of the first sub-main pattern MP_1 is equal to the sixth pitch Q1 of the first sub-mark pattern MKP_1. Similarly, the second pitch P2 of the second sub-main pattern MP_2 is equal or substantially equal to the seventh pitch Q2 of the second sub-mark pattern MKP_2. The third pitch P3 of the third sub-main pattern MP_3 is equal or substantially equal to the eighth pitch of the third sub-mark pattern MKP_3. The fourth pitch P4 of the fourth sub-main pattern MP_4 is equal or substantially equal to the ninth pitch Q3 of the fourth sub-mark pattern MKP_4. The fifth pitch P5 of the fifth sub-main pattern MP_5 is equal or substantially equal to the tenth pitch of the fifth sub-mark pattern MKP_5. However, the present inventive concept is not limited thereto.

Hereinafter, an integrated circuit layout according to some embodiments of the present inventive concept will be described with reference to FIGS. 6 to 9. For the convenience of description, descriptions duplicate with those as set forth above using FIGS. 1 to 5 are simply set forth, or omitted.

Figure 6:
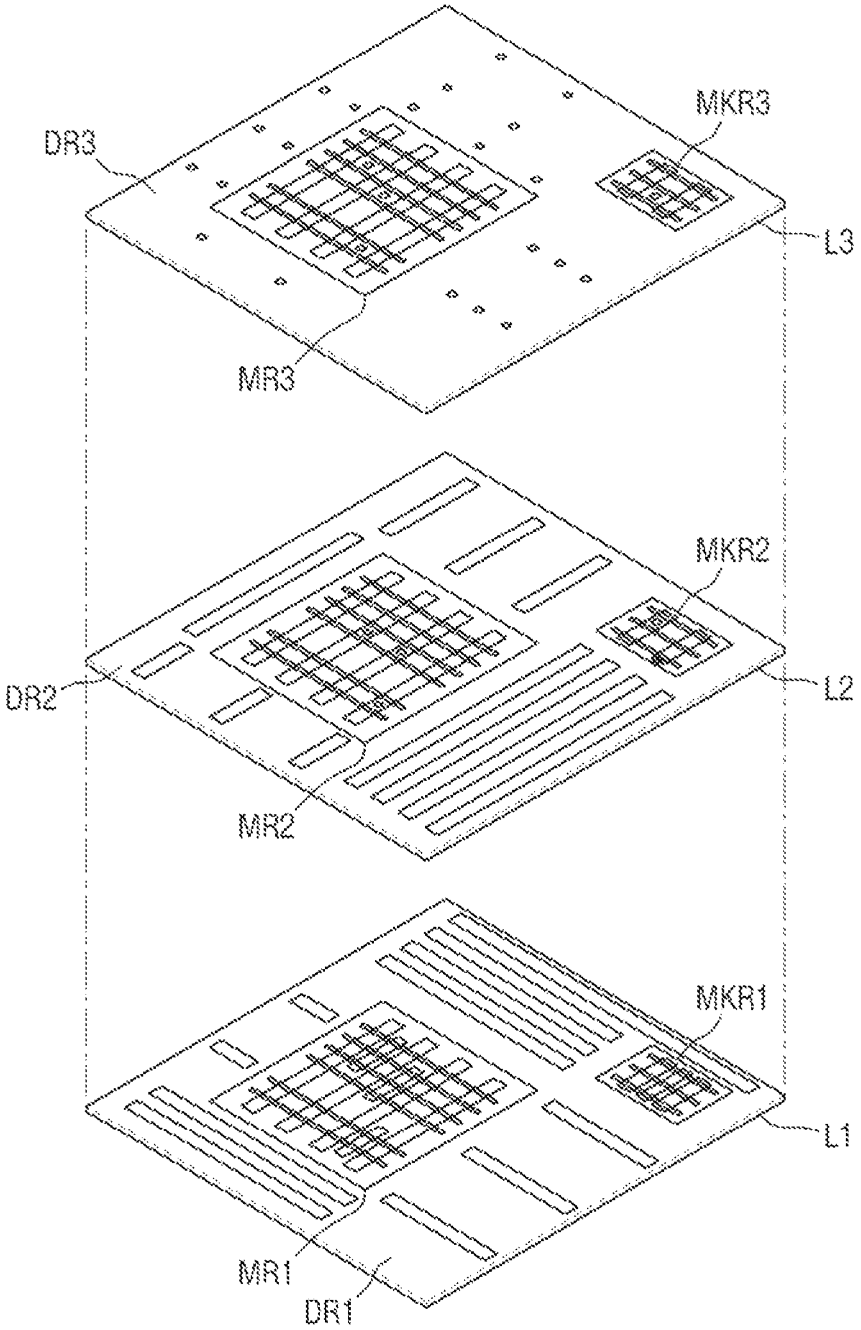
FIG. 6 is a perspective view illustrating a chip area according to some embodiments of the present inventive concept.
Figure 7:
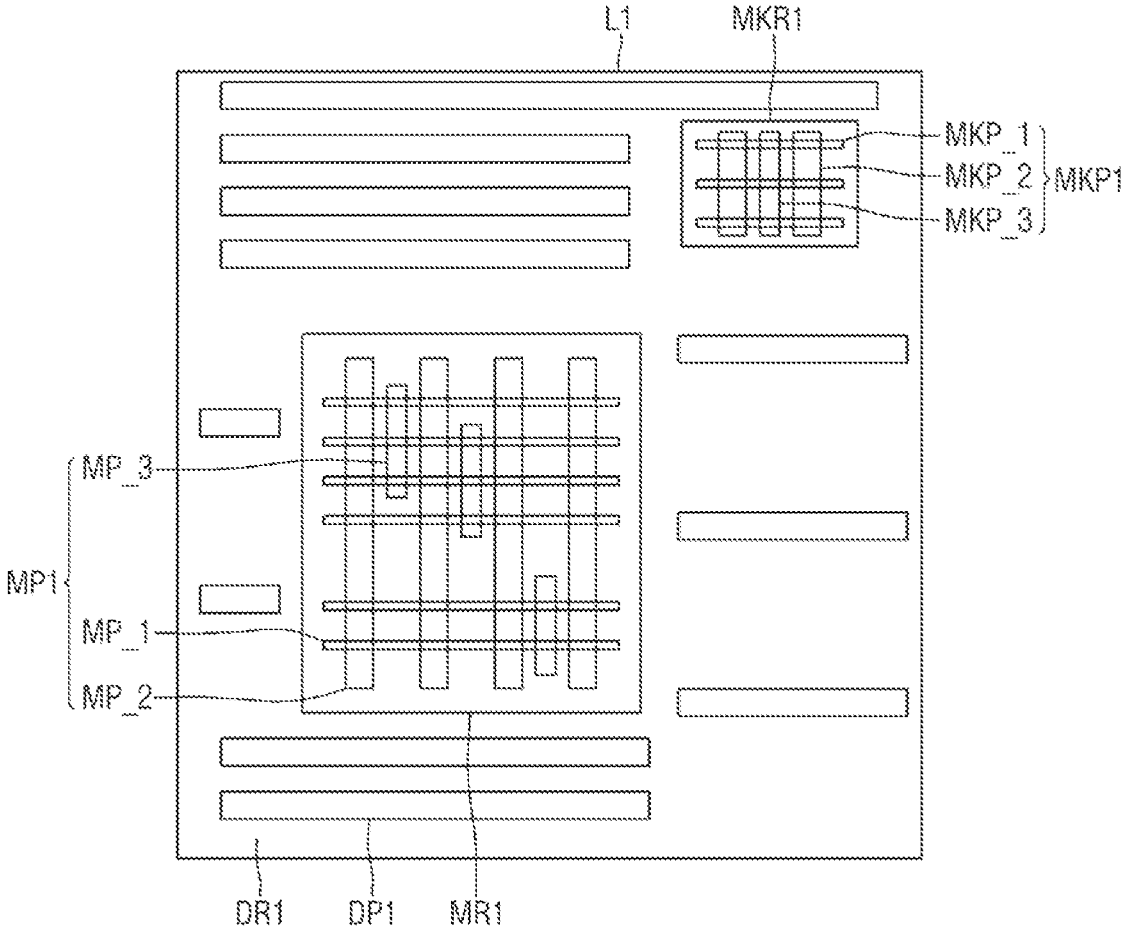
FIG. 7 is a diagram illustrating a first layer of FIG. 6.
Figure 8:
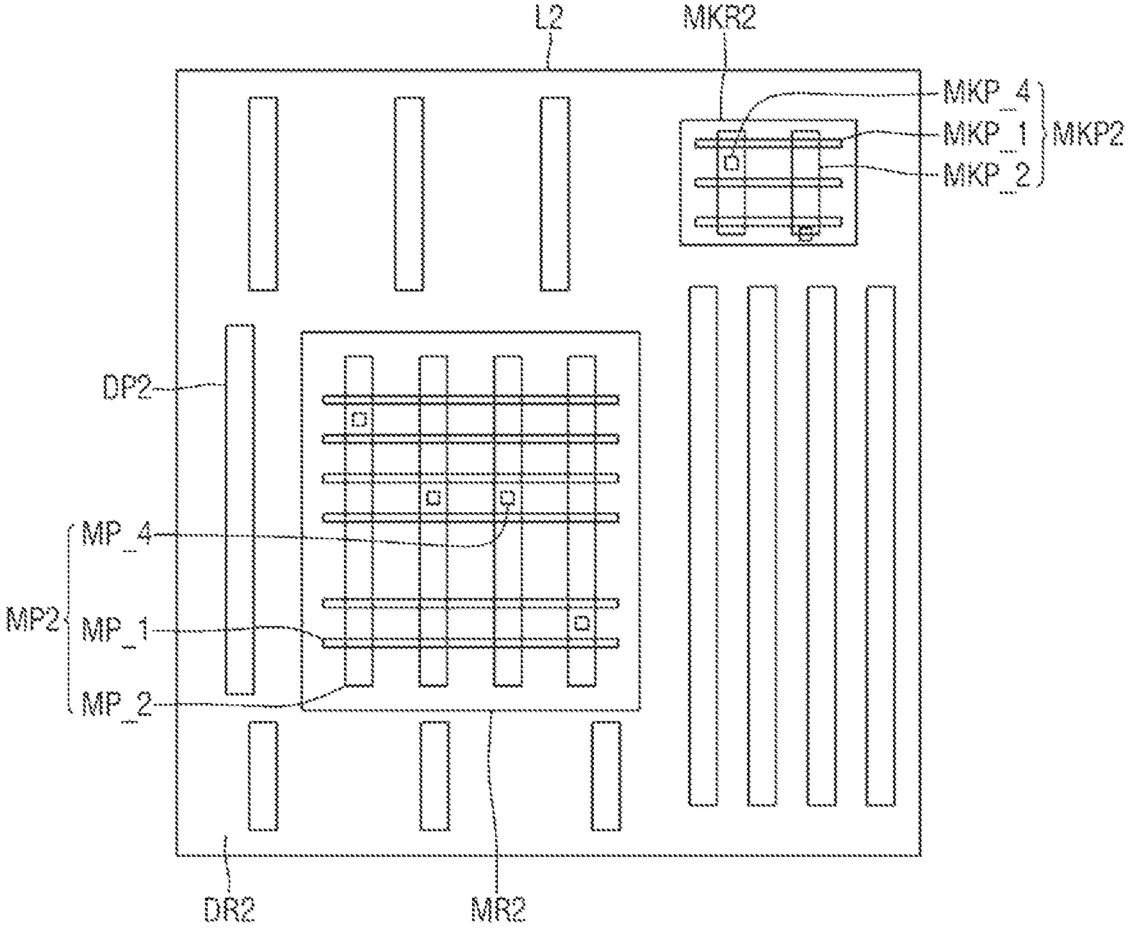
FIG. 8 is a diagram illustrating a second layer of FIG. 6.
Figure 9:
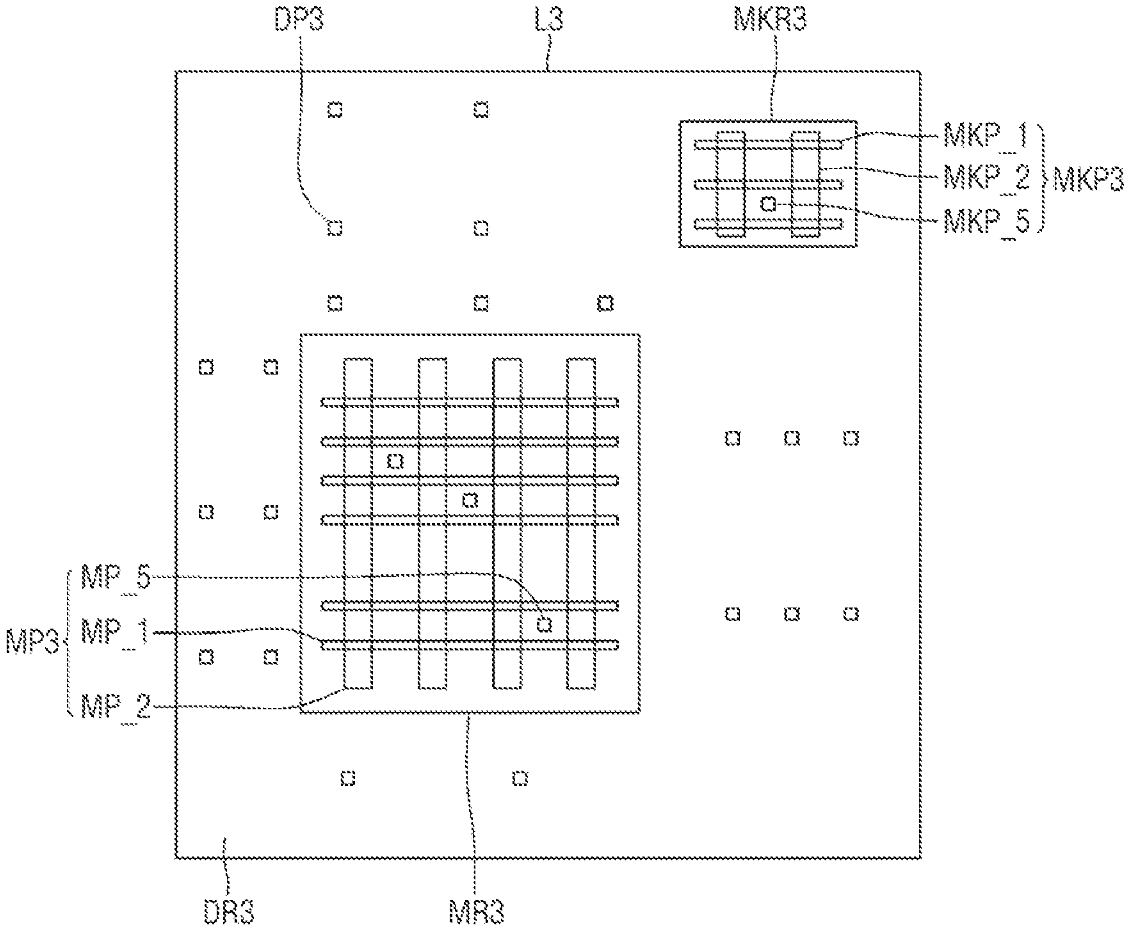
FIG. 9 is a diagram illustrating a third layer of FIG. 6.

FIG. 6 is a perspective view illustrating a chip area according to some embodiments of the present inventive concept. FIG. 7 is a diagram for illustrating a first layer of FIG. 6. FIG. 8 is a diagram illustrating a second layer of FIG. 6. FIG. 9 is a diagram illustrating a third layer of FIG. 6.

Referring to FIGS. 6 to 9, an integrated circuit layout according to some embodiments of the present inventive concept may include a first layer L1, a second layer L2, and a third layer L3.

For example, in the integrated circuit layout according to some embodiments of the present inventive concept, a plurality of layers may overlap each other. In FIGS. 6 to 9, the integrated circuit layout is illustrated as including three layers. However, the present inventive concept is not limited thereto. The number of layers included in the integrated circuit layout may vary according to a design.

In some embodiments of the present inventive concept, the first layer L1 may include a first main area MR1, a first dummy area DR1, and a first mark area MKR1. The second layer L2 may include a second main area MR2, a second dummy area DR2, and a second mark area MKR2. The third layer L3 may include a third main area MR3, a third dummy area DR3, and a third mark area MKR3.

A first main pattern MP1 may be formed in the first main area MR1. A first dummy pattern DP1 may be formed in the first dummy area DR1. A first mark pattern MKP1 may be formed in the first mark area MKR1. A second main pattern MP2 may be formed in the second main area MR2. A second dummy pattern DP2 may be formed in the second dummy area DR2. A second mark pattern MKP2 may be formed in the second mark area MKR2. A third main pattern MP3 may be formed in the third main area MR3. A third dummy pattern DP3 may be formed in the third dummy area DR3. A third mark pattern MKP3 may be formed in the third mark area MKR3.

Each of the first to third main patterns MP1, MP2, and MP3 may be identical to the main pattern MP as described using FIGS. 3 to 5. Each of the first to third mark patterns MKP1. MKP2, and MKP3 may be identical to the mark pattern MKP as described using FIGS. 3 to 5. Each of the first to third dummy patterns DP1. DP2, and DP3 may be identical to the dummy pattern DP as described using FIGS. 3 to 5.

In some embodiments of the present inventive concept, the first main area MR1 overlaps the second main area MR2. The second main area MR2 overlaps the third main area MR3. For example, the first to third main areas MR1, MR2, and MR3 overlap each other. The first mark area MKR1 overlaps the second mark area MKR2. The second mark area MKR2 overlaps with the third mark area MKR3. For example, the first to third mark areas MKR1, MKR2, and MKR3 overlap each other.

In FIG. 7, the first main pattern MP1 may include the first sub-main pattern MP_1, the second sub-main pattern MP_2, and the third sub-main pattern MP_3. The first main pattern MP1 does not include the fourth sub-main pattern MP_4 and the fifth sub-main pattern MP_5. The first mark pattern MKP1 may include the first sub-mark pattern MKP_1, the second sub-mark pattern MKP_2, and the third sub-mark pattern MKP_3. The first mark pattern MKP1 does not include the fourth sub-mark pattern MKP_4 and the fifth sub-mark pattern MKP_5.

In some embodiments of the present inventive concept, the design rule of the first mark pattern MKP1 complies with the design rule of the first main pattern MP1. The pitch of the first mark pattern MKP1 is equal or substantially equal to that of the first main pattern MP1.

In FIG. 8, the second main pattern MP2 may include the first sub-main pattern MP_1, the second sub-main pattern MP_2, and the fourth sub-main pattern MP_4. The second main pattern MP2 does not include the third sub-main pattern MP_3 and the fifth sub-main pattern MP_5. The second mark pattern MKP2 may include the first sub-mark pattern MKP_1, the second sub-mark pattern MKP_2, and the fourth sub-mark pattern MKP_4. The first mark pattern MKP1 does not include the third sub-mark pattern MKP_3 and the fifth sub-mark pattern MKP_5.

In some embodiments of the present inventive concept, the design rule of the second mark pattern MKP2 complies with the design rule of the second main pattern MP2. The pitch of the second mark pattern MKP2 is equal or substantially equal to that of the second main pattern MP2.

In FIG. 9, the third main pattern MP3 may include the first sub-main pattern MP_1, the second sub-main pattern MP_2, and the fifth sub-main pattern MP_5. The third main pattern MP3 does not include the third sub-main pattern MP_3 and the fourth sub-main pattern MP_4. The third mark pattern MKP3 may include the first sub-mark pattern MKP_1, the second sub-mark pattern MKP_2, and the fifth sub-mark pattern MKP_5. The third mark pattern MKP3 does not include the third sub-mark pattern MKP_3 and the fourth sub-mark pattern MKP_4.

In some embodiments of the present inventive concept, the design rule of the third mark pattern MKP3 complies with the design rule of the third main pattern MP3. The pitch of the third mark pattern MKP3 is equal or substantially equal to that of the third main pattern MP3.

Hereinafter, a method for manufacturing an integrated circuit device according to some embodiments of the present inventive concept will be described with reference to FIGS. 10 to 20.

In drawings related to an integrated circuit device according to some embodiments of the present inventive concept, a fin-type transistor (FinFET) including a channel area having a fin-type pattern is illustratively shown. However, the present inventive concept is not limited thereto. In an example, an integrated circuit device according to some embodiments of the present inventive concept may include a transistor including nanowires or nanosheets, an MBCFET™ (Multi-Bridge Channel Field Effect Transistor), or a vertical transistor (Vertical FET). In addition, an integrated circuit device according to some embodiments of the present inventive concept may include a tunneling transistor (tunneling FET), or a three-dimensional (3D) transistor. An integrated circuit device according to some embodiments of the present inventive concept may include a planar transistor. In addition, the technical idea of the present inventive concept may be applied to a transistor based on a two-dimensional material (2D material-based FET), and a heterostructure thereof.

Figure 10:
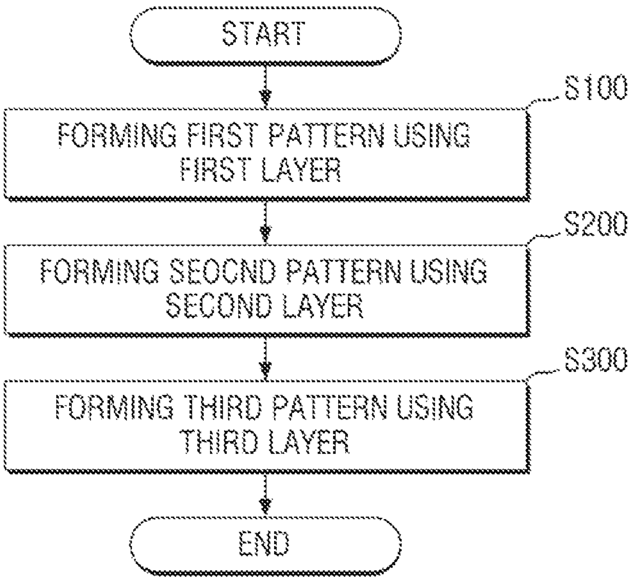
FIG. 10 is a flowchart illustrating a method of manufacturing an integrated circuit device according to some embodiments of the present inventive concept.

FIG. 10 is a flowchart illustrating a method of manufacturing an integrated circuit device according to some embodiments of the present inventive concept. FIGS. 11 to 20 are diagrams illustrating intermediate steps of a method of manufacturing an integrated circuit device according to some embodiments of the present inventive concept.

Referring to FIG. 10, a method for manufacturing an integrated circuit device according to some embodiments of the present inventive concept may include forming a first pattern using a first layer in S100, forming a second pattern using a second layer in S200, and forming a third pattern using a third layer S300.

The first to third layers L1, L2, and L3 may be the first to third layers L1, L2, and L3 shown in FIGS. 6 to 9, respectively.

Figure 20:
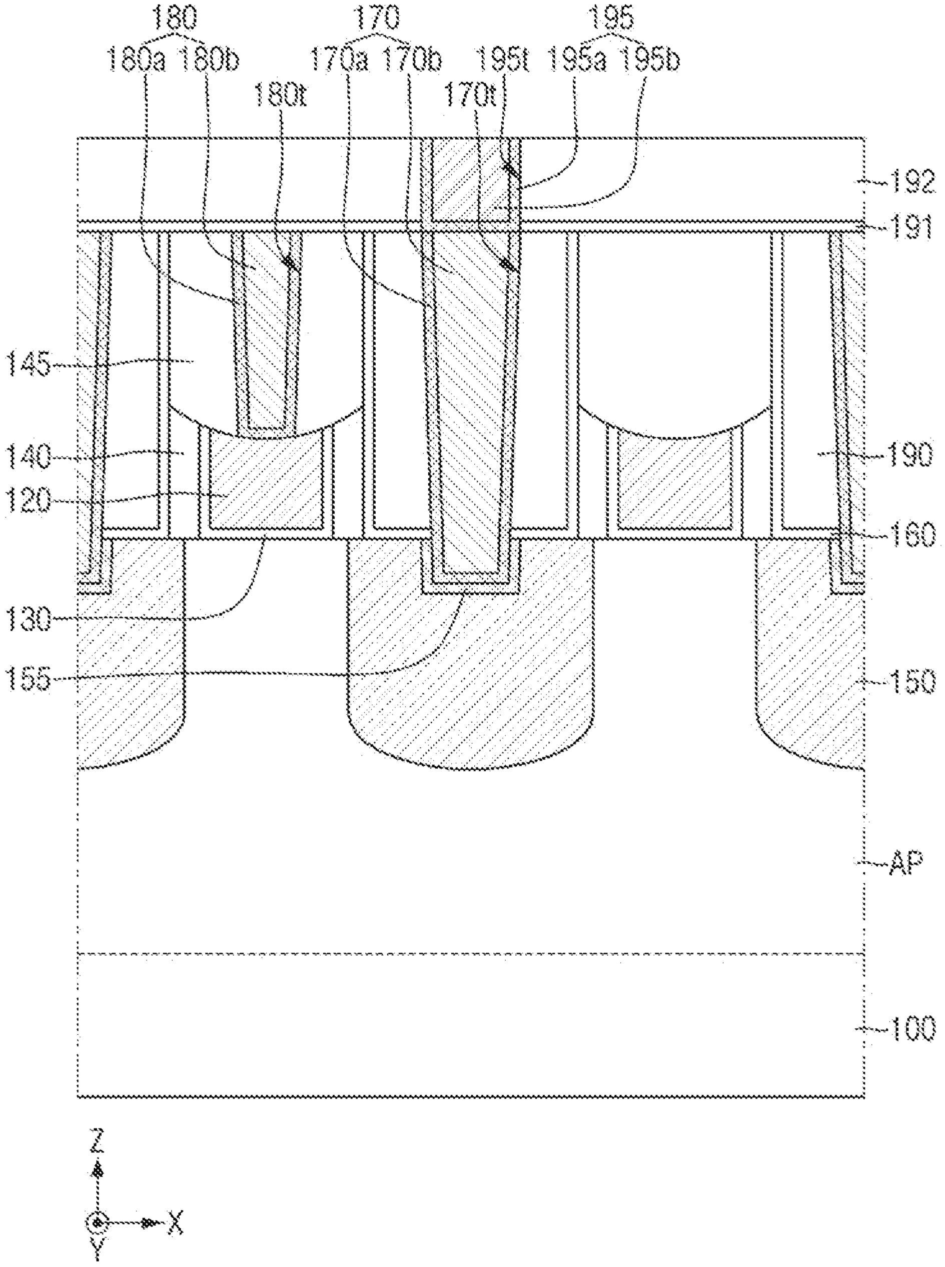

In one example, the first pattern may be an active contact (170 of FIG. 20). In another example, the first pattern may be the plurality of third sub-main patterns (MP_3 of FIG. 7). In another example, the first pattern may be the third sub-mark pattern (MKP_3 of FIG. 7). However, the present inventive concept is not limited thereto.

In one example, the second pattern may be a gate contact (180 in FIG. 20). In another example, the second pattern may be the plurality of fourth sub-main patterns (MP_4 of FIG. 8). In another example, the second pattern may be the plurality of fourth sub-mark patterns (MKP_4 of FIG. 8). However, the present inventive concept is not limited thereto.

In one example, the third pattern may be a via contact (195 of FIG. 20). In another example, the third pattern may be the plurality of fifth sub-main patterns (MP_5 of FIG. 9). In another example, the third pattern may be the fifth sub-mark pattern (MKP_5 of FIG. 9). However, the present inventive concept is not limited thereto.

Figure 11:
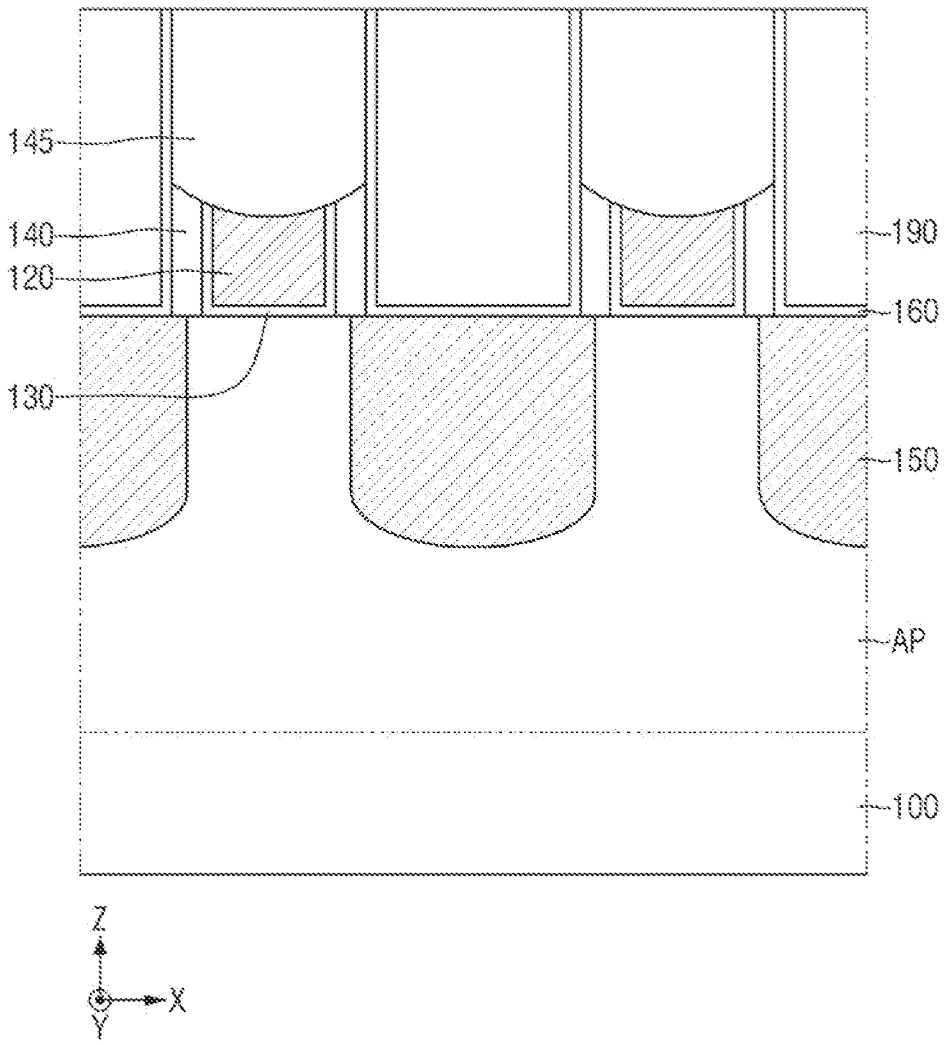
FIGS. 11, 12, 13, 14, 15, 16, 17, 18, 19, and 20 are diagrams illustrating intermediate steps of a method of manufacturing an integrated circuit device according to some embodiments of the present inventive concept.

Referring to FIG. 11, a substrate 100 may be provided.

The substrate 100 may include an active area and a field area. The active area may be an area where an active pattern AP is disposed. The field area may be disposed adjacent to the active area. For example, the field area may be disposed immediately adjacent to the active area. The field area and the active area may define a boundary therebetween.

At least two active areas are spaced apart from each other. At least two active areas may be isolated from each other via the field area. In other words, an element isolation film may be formed adjacent the active areas that are spaced apart from each other. In this case, a portion of the element isolation film disposed between the active areas may be the field area. For example, a portion where a channel area of a transistor which may be an example of an integrated circuit device is formed may be the active area, while a portion defining the channel area of the transistor formed in the active area may be the field area. In addition, the active area may be a portion where a fin-shaped pattern or a nanosheet used as the channel area of the transistor is formed, while the field area may be an area where the fin-shaped pattern or the nanosheet used as the channel area is not formed.

The substrate 100 may be, for example, a silicon substrate or an SOI (silicon-on-insulator) substrate. In addition, for example, the substrate 100 may include, but is not limited to, silicon-germanium, SGOI (silicon germanium on insulator), indium antimonide, lead telluride compound, indium arsenide, indium phosphide, gallium arsenide, or gallium antimonide.

An active pattern AP may be formed on the substrate 100. The active pattern AP may be the plurality of first sub-main patterns (MP_1 of FIG. 3) or the first sub-mark patterns (MKP_1 of FIG. 3) as described above.

The active pattern AP may extend in an elongated manner along a first direction X. The active pattern AP may include a long side extending in the first direction X and a short side extending in a second direction Y. In this regard, the first direction X may intersect the second direction Y and a third direction Z. In addition, the second direction Y may intersect the third direction Z. The third direction Z may be a thickness direction of the substrate 100.

The active pattern AP may be a multi-channel active pattern. In the integrated circuit device according to some embodiments of the present inventive concept, the active pattern AP may be, for example, a fin-type pattern. The active pattern AP may be used as a channel area of a transistor.

The active pattern AP may be a portion of the substrate 100 or may include an epitaxial layer grown from the substrate 100. The active pattern AP may include, for example, elemental semiconductor materials such as silicon or germanium. Moreover, the active pattern AP may include a compound semiconductor, for example, a group IV-IV compound semiconductor or a group III-V compound semiconductor.

The group IV-IV compound semiconductor may include, for example, a binary compound including two of carbon (C), silicon (Si), germanium (Ge), and tin (Sn), a ternary compound including three thereof, or a compound obtained by doping a group IV element thereto.

The group III-V compound semiconductor may include, for example, a binary compound obtained by combining one of aluminum (Al), gallium (Ga), and indium (In) as a group III element and one of phosphorus (P), arsenic (As), and antimony (Sb) as a group V element with each other, a ternary compound obtained by combining two of aluminum (Al), gallium (Ga), and indium (In) as a group III element and one of phosphorus (P), arsenic (As), and antimony (Sb) as a group V with each other, or a quaternary compound obtained by combining three of aluminum (Al), gallium (Ga), and indium (In) as a group III element and one of phosphorus (P), arsenic (As), and antimony (Sb) as a group V with each other.

Gate spacers 140 may be formed on the substrate 100. Each of the gate spacers 140 may extend in the second direction Y. Each of the gate spacers 140 may include, for example, at least one of silicon nitride (SiN), silicon oxynitride (SiON), silicon oxide ($SiO_2$), silicon oxycarbonitride (SiOCN), silicon boron nitride (SiBN), silicon oxyboron nitride (SiOBN), silicon oxycarbide (SiOC), and combinations thereof. The present inventive concept is not limited thereto.

A dummy gate electrode may be formed between the gate spacers 140. The dummy gate electrode may include, for example, a polysilicon film.

Subsequently, the dummy gate electrode may be removed. A gate insulating film 130 and a gate electrode 120 may be formed in a space in which the dummy gate electrode has been removed. The gate electrode 120 may be the plurality of second sub-main patterns (MP_2 of FIG. 3) or the second sub-mark pattern (MKP_2 of FIG. 3) as described above.

First, the gate insulating film 130 may be formed along a sidewall of the gate spacer 140 and an upper surface of the active pattern AP. The gate insulating film 130 may be conformally formed.

The gate insulating film 130 may include, for example, silicon oxide, silicon oxynitride, silicon nitride, or a high-k material having a dielectric constant higher than that of silicon oxide. The high dielectric constant (high-k) material may include at least one of, for example, boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and/or lead zinc niobate.

Although the gate insulating film 130 is illustrated as a single film, this is only an example, and the present inventive concept is not limited thereto. The gate insulating film 130 may include a plurality of films.

The integrated circuit device according to some embodiments of the present inventive concept may include an NC (Negative Capacitance) FET using a negative capacitor. For example, the gate insulating film 130 may include a ferroelectric material film having ferroelectric properties and a paraelectric material film having paraelectric properties.

The ferroelectric material film may have negative capacitance, and the paraelectric material film may have positive capacitance. For example, when two or more capacitors may be connected in series to each other, and capacitance of each of the capacitors has a positive value, a total capacitance is smaller than capacitance of each individual capacitor. In addition, when at least one of capacitances of two or more capacitors connected in series to each other has a negative value, a total capacitance may have a positive value and be greater than an absolute value of each individual capacitance.

When the ferroelectric material film with negative capacitance and the paraelectric material film with positive capacitance are connected in series to each other, a total capacitance value of the ferroelectric material film and the paraelectric material film connected in series to each other may be increased. Using the increase in the total capacitance value, a transistor including the ferroelectric material film may have a subthreshold swing (SS) lower than about 60 mV/decade at about room temperature.

The ferroelectric material film may have ferroelectric properties. The ferroelectric material film may include, for example, at least one of hafnium oxide, hafnium zirconium oxide, barium strontium titanium oxide, barium titanium oxide, and lead zirconium titanium oxide. In this connection, in one example, hafnium zirconium oxide may refer to a material obtained by doping hafnium oxide with zirconium (Zr). In another example, hafnium zirconium oxide may refer to a compound of hafnium (Hf), zirconium (Zr), and oxygen (O).

The ferroelectric material film may further contain doped dopants. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr) and/or tin (Sn). A type of the dopant included in the ferroelectric material film may vary depending on a type of the ferroelectric material included in the ferroelectric material film.

When the ferroelectric material film includes hafnium oxide, the dopant included m the ferroelectric material film may include, for example, at least one of gadolinium (Gd), silicon (Si), zirconium (Zr), aluminum (Al), and/or yttrium (Y).

When the dopant is aluminum (Al), the ferroelectric material film may include about 3 to about 8 at % (atomic %) of aluminum. In this connection, a content of the dopant may be a content of aluminum based on a sum of hafnium and aluminum.

When the dopant is silicon (Si), the ferroelectric material film may include about 2 to about 10 at % of silicon. When the dopant is yttrium (Y), the ferroelectric material film may include about 2 to about 10 at % yttrium. When the dopant is gadolinium (Gd), the ferroelectric material film may include about 1 to about 7 at % gadolinium. When the dopant is zirconium (Zr), the ferroelectric material film may include about 50 to about 80 at % zirconium.

The paraelectric material film may have paraelectric properties. The paraelectric material film may include, for example, at least one of silicon oxide and metal oxide having a high dielectric constant. Although the metal oxide contained in the paraelectric material film may include, for example, at least one of hafnium oxide, zirconium oxide and/or aluminum oxide. However, the present inventive concept is not limited thereto.

The ferroelectric material film and the paraelectric material film may include the same material as each other. The ferroelectric material film may have ferroelectric properties, but the paraelectric material film might not have the ferroelectric properties. For example, when each of the ferroelectric material film and the paraelectric material film includes hafnium oxide, a crystal structure of hafnium oxide included in the ferroelectric material film is different from a crystal structure of hafnium oxide included in the paraelectric material film.

The ferroelectric material film may have a predetermined thickness such that ferroelectric properties are exhibited. Although the thickness of the ferroelectric material film may be, for example, in a range of about 0.5 to about 10 nm, the present inventive concept is not limited thereto. Because a critical thickness exhibiting the ferroelectric properties may vary based on a type of the ferroelectric material, the thickness of the ferroelectric material film may vary depending on the type of the ferroelectric material.

In one example, the gate insulating film 130 may include one ferroelectric material film. In another example, the gate insulating film 130 may include a plurality of ferroelectric material films that are spaced apart from each other. The gate insulating film 130 may have a multilayer structure in which a plurality of ferroelectric material films and a plurality of paraelectric material films are alternately stacked on top of each other.

Subsequently, the gate electrode 120 may be formed on the gate insulating film 130. For example, the gate electrode 120 may be formed on the active pattern AP. The gate electrode 120 may extend in the second direction Y. The gate electrodes 120 may be spaced apart from each other in the first direction X.

The gate electrodes 120 may be formed on the active pattern AP. The gate electrodes 120 may cover the active pattern AP. The gate electrodes 120 may intersect the active pattern AP. Each of the gate electrodes 120 may include a long side extending in the second direction Y and a short side extending in the first direction X.

Each of the gate electrodes 120 may include at least one of, for example, titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and combinations thereof. The present inventive concept is not limited thereto.

Each of the gate electrodes 120 may include a conductive metal oxide, a conductive metal oxynitride, or the like, and may include an oxidized product of each of the above-mentioned materials. The present inventive concept is not limited thereto.

The gate electrode 120 may be disposed on each of both opposing sides of a source/drain pattern 150, which is to be formed later.

The gate capping film 145 may be formed on the gate electrode 120. The gate capping film 145 may include, for example, at least one of silicon nitride (SiN), silicon oxynitride (SiON), silicon oxide ($SiO_2$), silicon carbonitride (SiCN), silicon oxycarbonitride (SiOCN), or combinations thereof.

The source/drain pattern 150 may be formed on the substrate 100. The source/drain pattern 150 may be formed on the active pattern AP. The source/drain pattern 150 may be connected to the active pattern AP.

The source/drain pattern 150 may be formed adjacent to a side surface of each of the plurality of gate electrodes 120 in a plan view. The source/drain pattern 150 may be formed between adjacent ones of the plurality of gate electrodes 120.

For example, the source/drain pattern 150 may be formed adjacent to each of both opposing sides of the plurality of gate electrodes 120. In an embodiment of the present inventive concept, the source/drain pattern 150 may be formed on one side of each of the plurality of gate electrodes 120 and might not be formed on the other side of each of the plurality of gate electrodes 120.

The source/drain pattern 150 may include an epitaxial pattern. The source/drain pattern 150 may include a semiconductor material. The source/drain pattern 150 may be included in a source/drain of a transistor that uses the active pattern AP as a channel area. The source/drain pattern 150 may be connected to the channel area of the active pattern AP that is used as a channel of the transistor.

Subsequently, the etch stop film 160 may be formed. The etch stop film 160 may extend along a sidewall of the gate spacer 140 and a profile of the source/drain pattern 150. The etch stop film 160 may include a material having an etch selectivity with respect to a material of a first interlayer insulating film 190, which is to be described later. The etch stop film 160 may include, for example, a nitride-based insulating material. For example, the etch stop film 160 may include at least one of silicon nitride (SiN), silicon oxynitride (SiON), silicon oxycarbonitride (SiOCN), silicon boron nitride (SiBN), silicon oxyboronitride (SiOBN), or combinations thereof.

The first interlayer insulating film 190 may be formed on the etch stop film 160. The first interlayer insulating film 190 may be formed on the source/drain pattern 150. The first interlayer insulating film 190 might not cover an upper surface of the gate capping film 145. For example, an upper surface of the first interlayer insulating film 190 may be substantially coplanar with the upper surface of the gate capping film 145.

The first interlayer insulating film 190 may include, for example, at least one of silicon oxide, silicon nitride, silicon oxynitride, and/or a low dielectric constant material. The low dielectric constant material may include, for example, fluorinated tetraethylorthosilicate (FTEOS), hydrogen silsesquioxane (HSQ), bis-benzocyclobutene (BCB), tetramethylorthosilicate (TMOS), octamethyleyclotetrasiloxane (OMCTS), hexamethyldisiloxane (HMDS), trimethylsilyl borate (TMSB), diacetoxyditertiarybutosiloxane (DADBS), trimethylsilil phosphate (TMSP), polytetrafluoroethylene (PTFE), TOSZ (Tonen SilaZen), FSG (fluoride silicate glass), polyimide nanofoams such as polypropylene oxide, CDO (carbon doped silicon oxide), OSG (organo silicate glass), SiLK, amorphous fluorinated carbon, silica aerogels, silica xerogels, mesoporous silica, or combinations thereof. However, the present inventive concept is not limited thereto.

Figure 12:
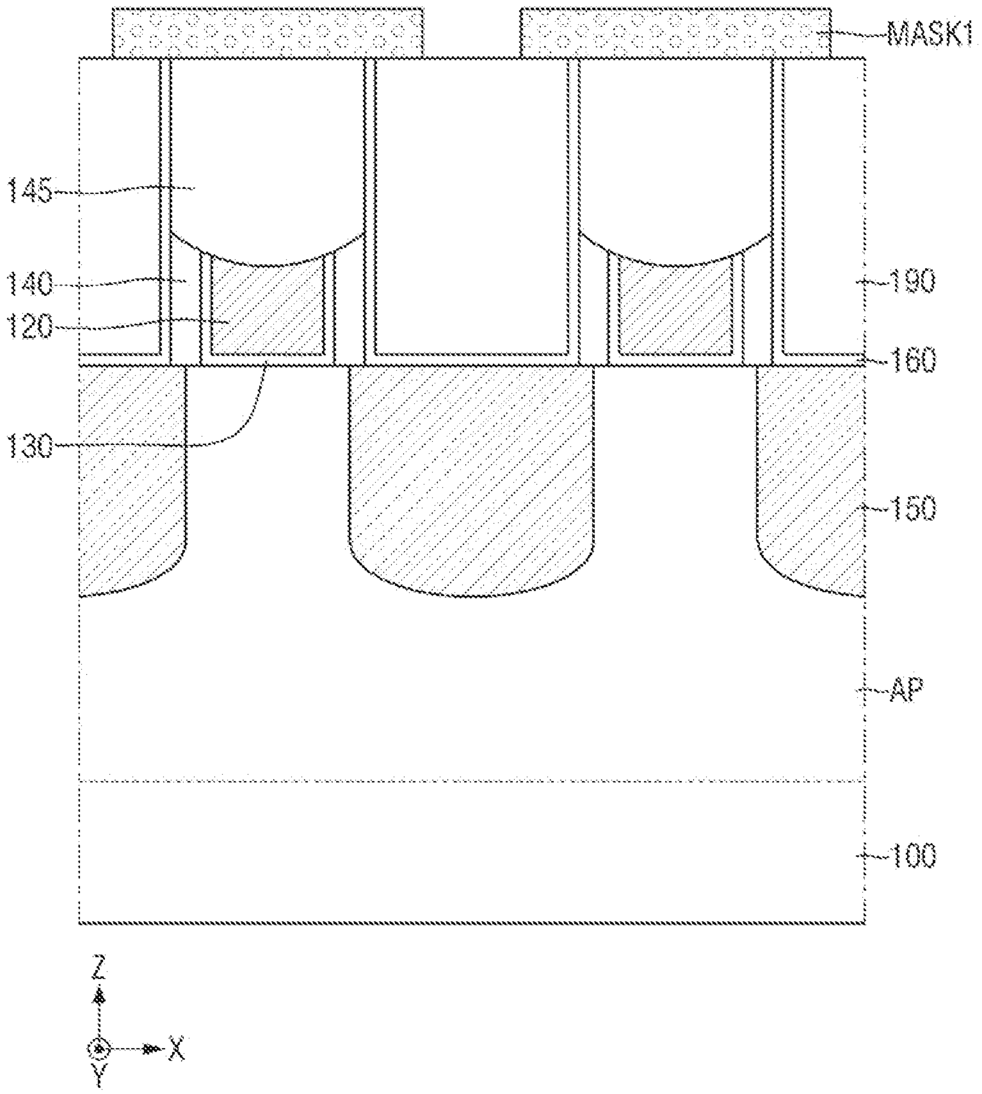

Referring to FIG. 12, a first mask film MASK1 may be formed on the gate capping film 145 and the first interlayer insulating film 190. For example, the first mask film MASK1 may be formed on the etch stop film 160. The first mask film MASK1 may be formed using the first layer (L1 of FIG. 6). The first mask film MASK1 may include at least one of, for example, a photoresist film, an ACL (Amorphous Carbon Layer), an SOH (Spin on Hardmask), an SOC (Spin on Carbon), or a silicon nitride film. The first mask film MASK1 may have an opening defined therein that roughly defines a position of the active contact 170, which is to be described later.

Figure 13:
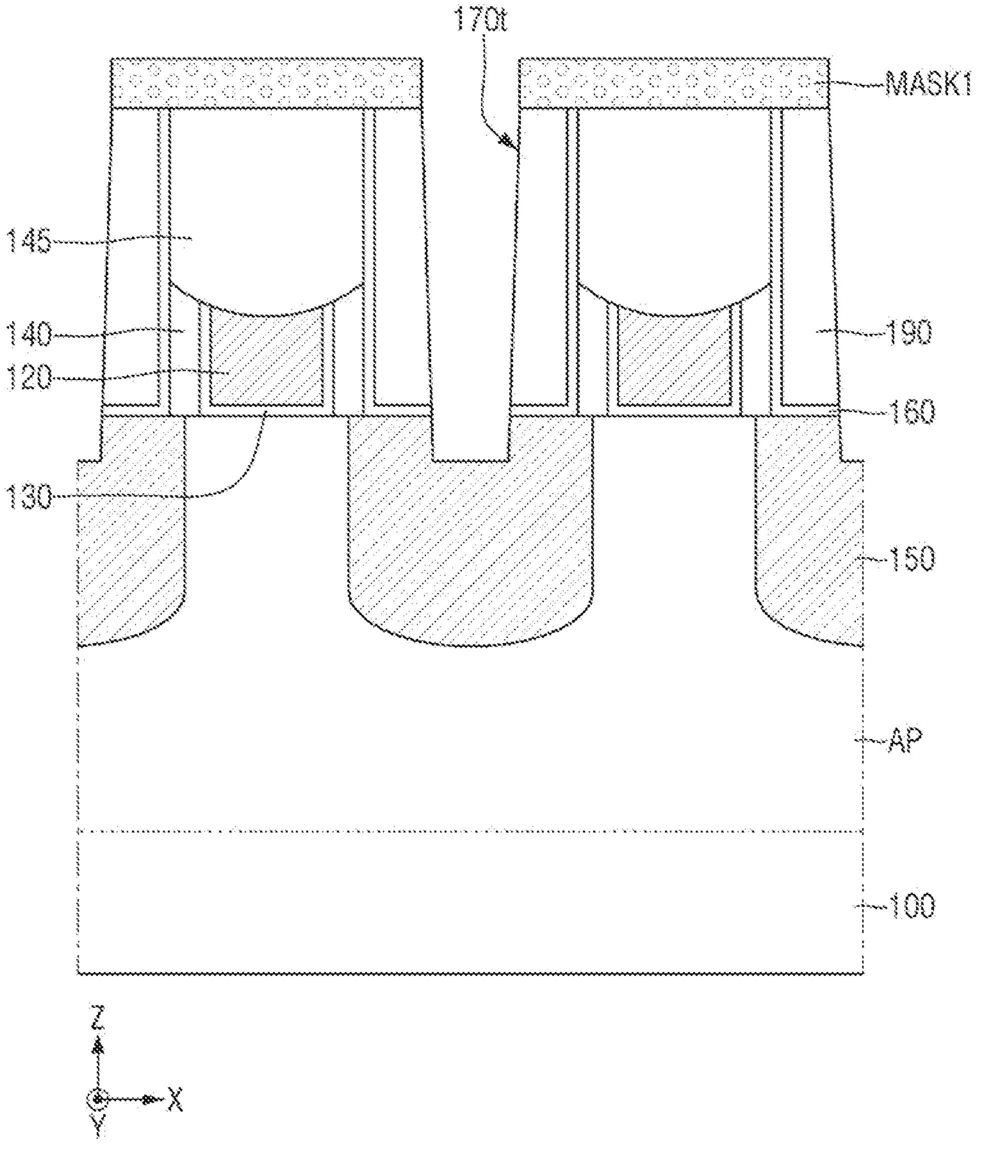

Referring to FIG. 13, an active contact trench 170*t* may be formed by using the first mask film MASK1.

The active contact trench 170*t* may be formed by removing a portion of each of the first interlayer insulating film 190, the etch stop film 160, and the source/drain pattern 150. The active contact trench 170*t* may expose the first interlayer insulating film 190, the etch stop film 160, and the source/drain pattern 150.

Figure 14:
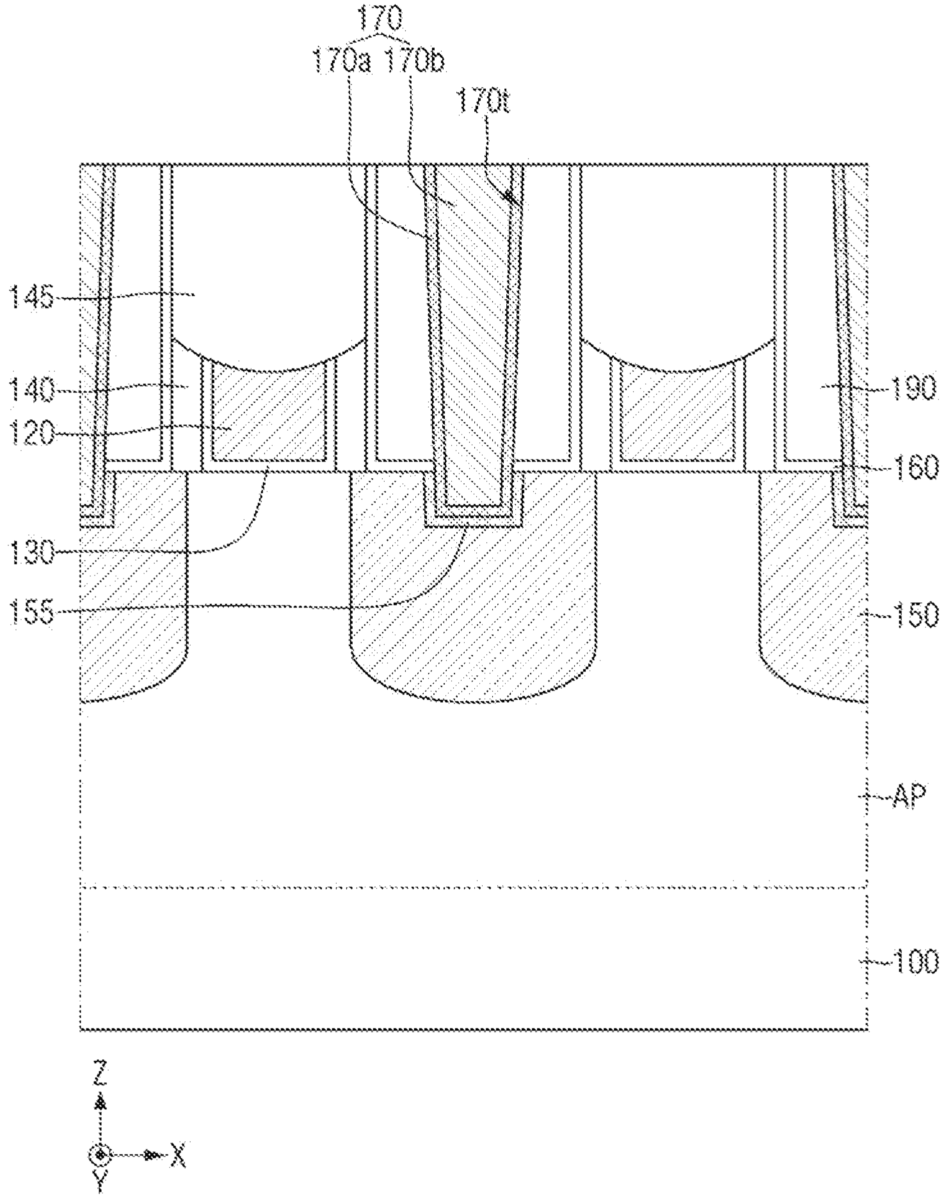

Referring to FIG. 14, the active contact 170 may be formed in the active contact trench 170*t*. First, an active contact barrier film 170*a* may be formed along a sidewall and a bottom surface of the active contact trench 170*t*. Subsequently, an active contact filling film 170*b* may be formed on the active contact barrier film 170*a*.

In some embodiments of the present inventive concept, a contact silicide layer 155 may be formed in a process of forming the active contact barrier film 170*a*. The contact silicide layer 155 may be formed between the active contact barrier film 170*a* and the source/drain pattern 150. The contact silicide layer 155 may include, for example, a metal silicide material.

The active contact barrier film 170*a* may include, for example, at least one of tantalum (Ta), tantalum nitride (TaN), titanium (Ti), titanium nitride (TiN), titanium silicon nitride (TiSiN), ruthenium (Ru), cobalt (Co), nickel (Ni), nickel boron (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), rhodium (Rh) and a two-dimensional (2D) material. In an integrated circuit device according to some embodiments of the present inventive concept, the two-dimensional material may be a metallic material and/or a semiconductor material. The two-dimensional material may include two-dimensional allotrope or two-dimensional compound. For example, the two-dimensional material may include at least one of graphene, molybdenum disulfide ($MoS_2$), molybdenum diselenide ($MoSe_2$), tungsten diselenide ($WSe_2$), and tungsten disulfide ($WS_2$). However, the present inventive concept is not limited thereto. For example, the above-described two-dimensional materials are only listed by way of example. The two-dimensional materials that may be included in the integrated circuit device of the present inventive concept are not limited to the above-mentioned materials.

The active contact filling film 170*b* may include, for example, at least one of aluminum (Al), tungsten (W), cobalt (Co), ruthenium (Ru), silver (Ag), gold (Au), manganese (Mn), and/or molybdenum (Mo).

The active contact 170 is illustrated as including a plurality of conductive films. However, the present inventive concept is not limited thereto. In an embodiment of the present inventive concept, the active contact 170 may be composed of a single film.

Figure 15:
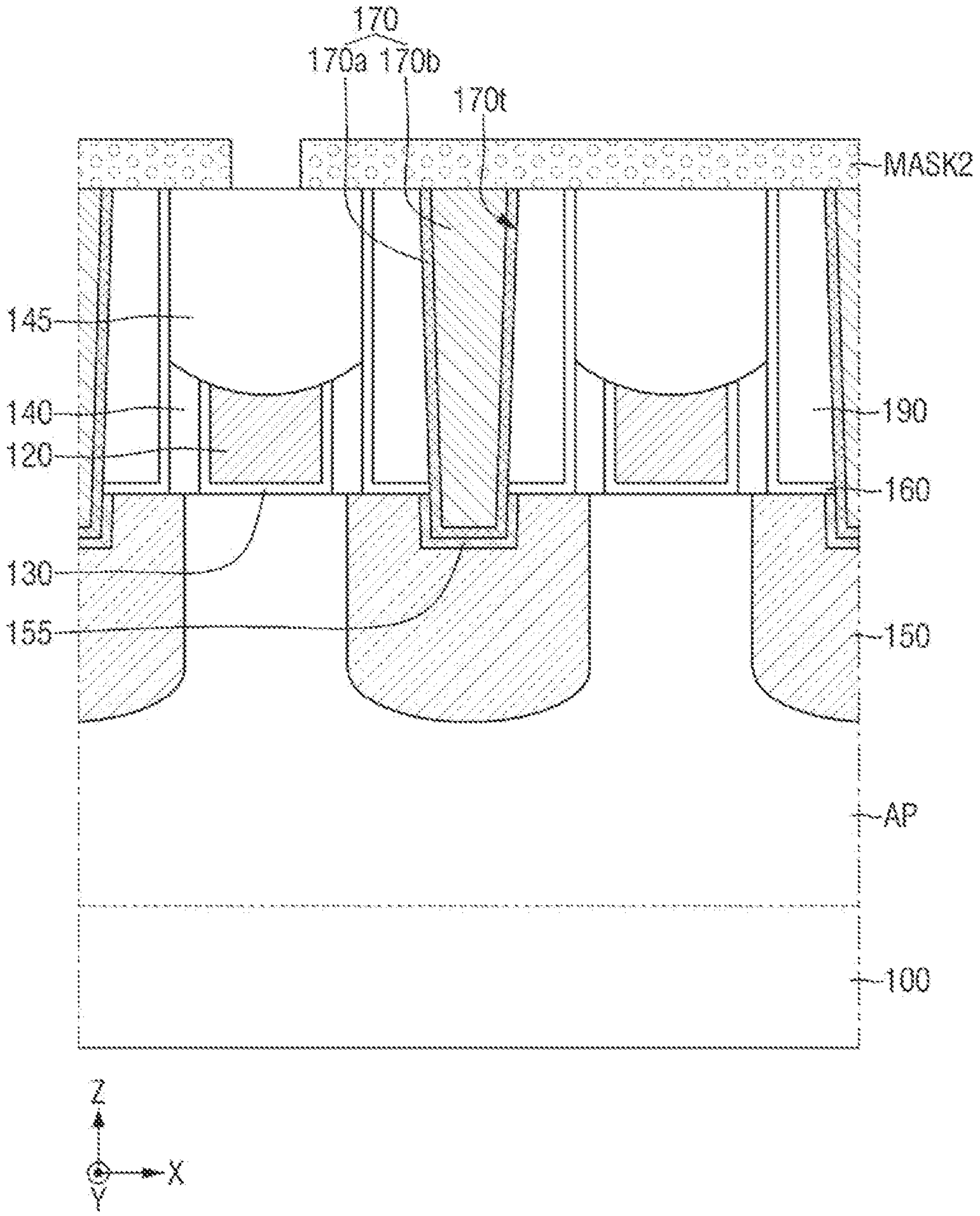

Referring to FIG. 15, a second mask film MASK2 may be formed on the active contact 170, the first interlayer insulating film 190, and the gate capping film 145. For example, the second mask film MASK2 may be disposed on the first interlayer insulating layer 190. The second mask film MASK2 may be formed using the second layer (L2 of FIG. 6). The second mask film MASK2 may include at least one of, for example, a photoresist film, an ACL (Amorphous Carbon Layer), an SOH (Spin on Hardmask), an SOC (Spin on Carbon), and/or a silicon nitride film. The second mask film MASK2 may have an opening provided therein for forming a position of the gate contact 180, which is to be described later.

Figure 16:
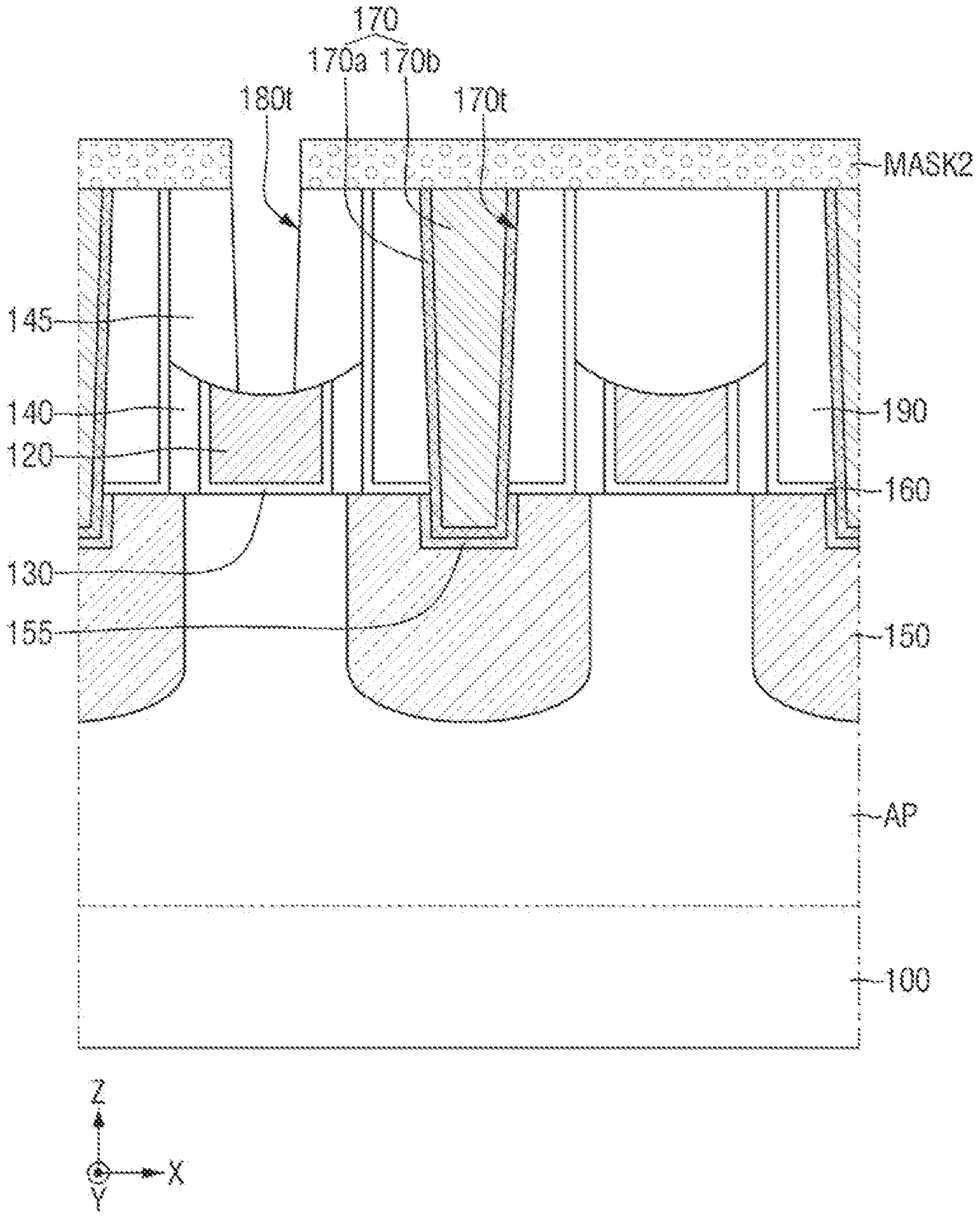

Referring to FIG. 16, a gate contact trench 180*t* may be formed using the second mask film MASK2. The gate contact trench 180*t* may be formed by removing the gate capping film 145. The gate contact trench 180*t* may expose a portion of an upper surface of the gate electrode 120.

Figure 17:
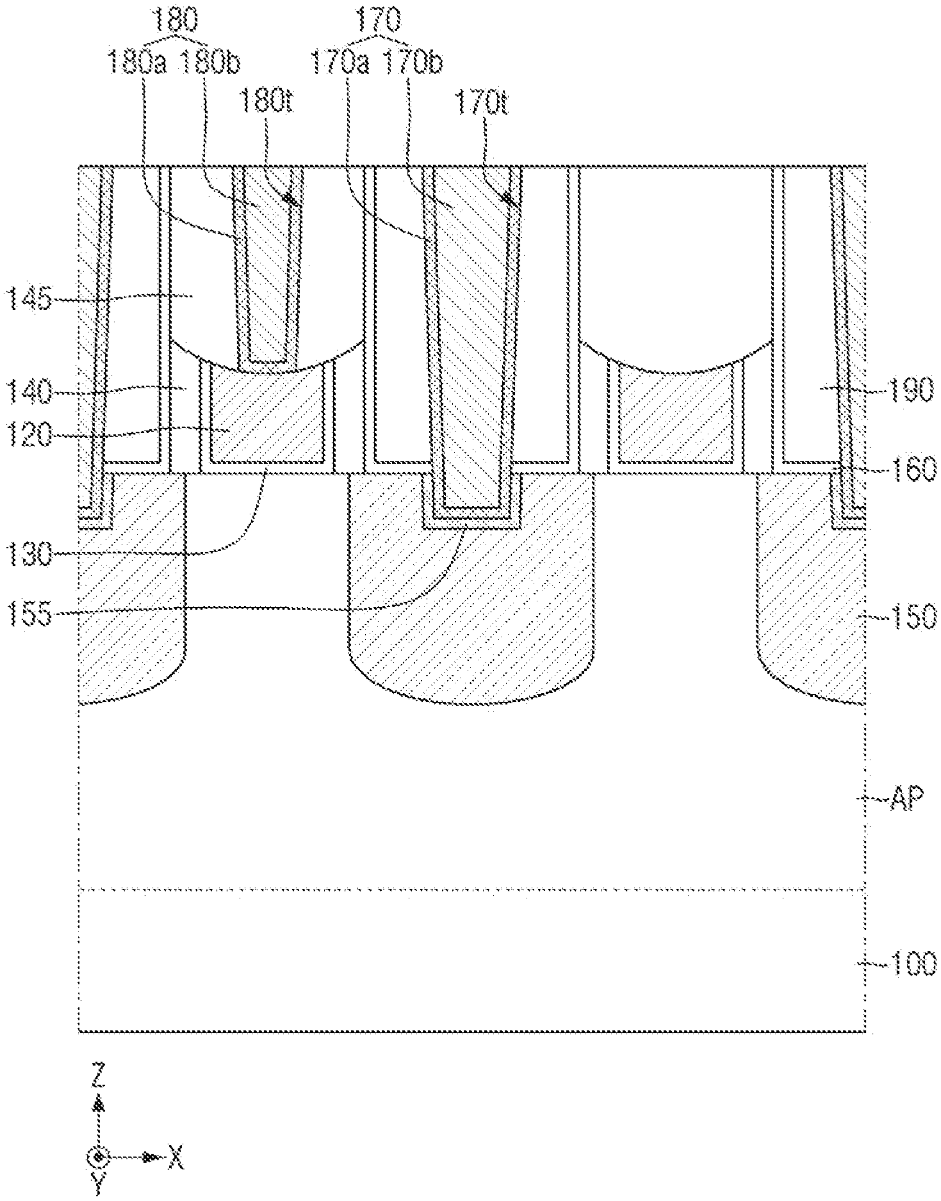

Referring to FIG. 17, the gate contact 180 may be formed in the gate contact trench 180*t*. First, a gate contact barrier film 180*a* may be formed along a sidewall and a bottom surface of the gate contact trench 180*t*. Subsequently, a gate contact filling film 180*b* may be formed on the gate contact barrier film 180*a*.

The gate contact barrier film 180*a* may include, for example, at least one of tantalum (Ta), tantalum nitride (TaN), titanium (Ti), titanium nitride (TiN), titanium silicon nitride (TiSiN), ruthenium (Ru), cobalt (Co), nickel (Ni), nickel boron (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), rhodium (Rh) and a two-dimensional (2D) material. In an integrated circuit device according to some embodiments of the present inventive concept, the two-dimensional material may be a metallic material and/or a semiconductor material. The two-dimensional material may include two-dimensional allotrope or two-dimensional compound. For example, the two-dimensional material may include at least one of graphene, molybdenum disulfide ($MoS_2$), molybdenum diselenide ($MoSe_2$), tungsten diselenide ($WSe_2$), and/or tungsten disulfide ($WS_2$). However, the present inventive concept is not limited thereto. For example, the above-described two-dimensional materials are listed by way of example. The two-dimensional materials that may be included in the integrated circuit device, according to an embodiment of the present inventive concept, are not limited to the above-mentioned materials.

The gate contact filling film 180*b* may include, for example, at least one of aluminum (Al), tungsten (W), cobalt (Co), ruthenium (Ru), silver (Ag), gold (Au), manganese (Mn), and/or molybdenum (Mo).

The gate contact 180 is illustrated as including a plurality of conductive films. However, the present inventive concept is not limited thereto. In an embodiment of the present inventive concept, the gate contact 180 may be a single film.

Figure 18:
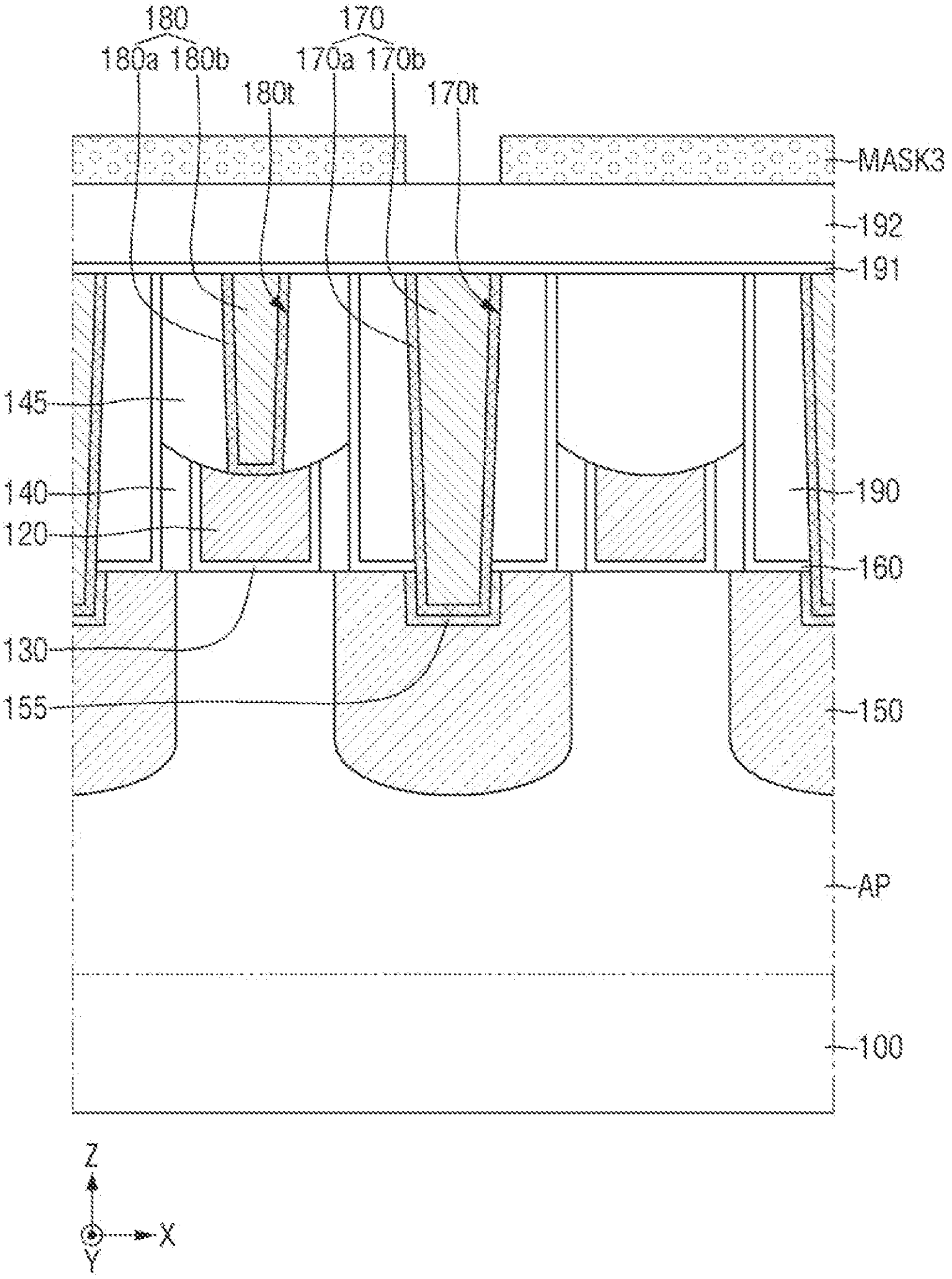

Referring to FIG. 18, an upper stop film 191 may be formed on the gate contact 180, the active contact 170, the gate capping film 145, and the first interlayer insulating film 190. For example, the upper stop film 191 may be formed on the etch stop film 160. The upper stop film 191 may extend along an upper surface of the gate contact 180, an upper surface of the active contact 170, an upper surface of the gate capping film 145, and an upper surface of the first interlayer insulating film 190.

The upper stop film 191 may include a material having an etch selectivity with respect to that of a second interlayer insulating film 192, which is to be described later. The upper stop film 191 may include at least one of, for example, silicon nitride (SiN), silicon oxynitride (SiON), silicon oxycarbonitride (SiOCN), silicon boron nitride (SiBN), silicon oxyboronitride (SiOBN), silicon oxycarbide (SiOC), aluminum oxide (AlO), aluminum nitride (AlN), aluminum oxycarbide (AlOC), or combinations thereof. For example, the upper stop film 191 is shown as a single film. However, the present inventive concept is not limited thereto. In an embodiment of the present inventive concept, the upper stop film 191 might not be formed.

The second interlayer insulating film 192 may be formed on the upper stop film 191. The second interlayer insulating film 192 may include an insulating material. The second interlayer insulating film 192 may include, for example, at least one of silicon oxide, silicon nitride, silicon carbonitride, silicon oxynitride, and/or a low-k material.

A third mask film MASK3 may be formed on the second interlayer insulating film 192. The third mask film MASK3 may be formed using the third layer L3. The third mask film MASK3 may be composed of at least one of, for example, a photoresist film, an ACL (Amorphous Carbon Layer), an SOH (Spin on Hardmask), an SOC (Spin on Carbon), or a silicon nitride film. The third mask film MASK3 may have an opening formed therein to form the via contact 195, which is to be described later.

Figure 19:
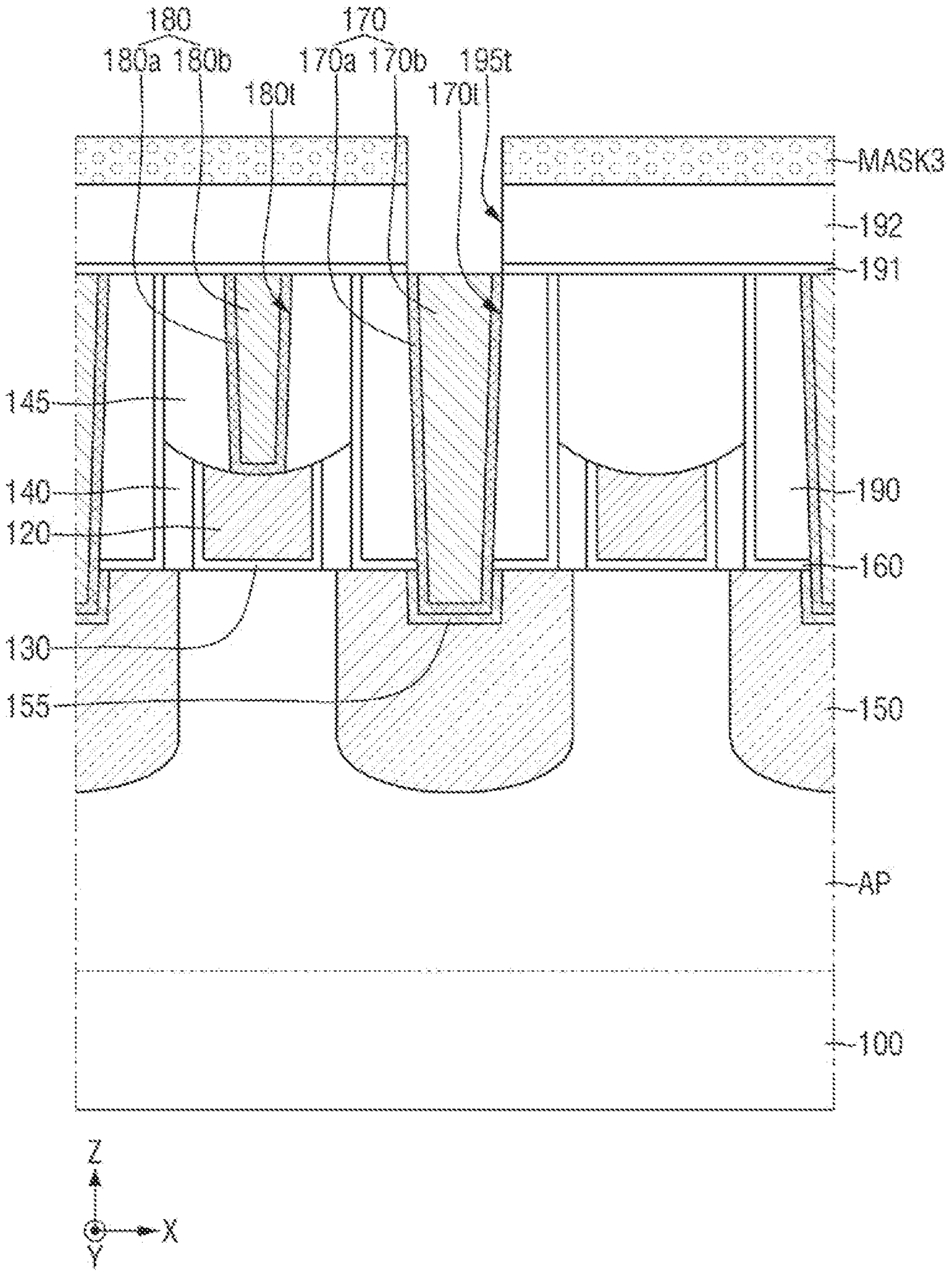

Referring to FIG. 19, a via contact trench 195*t* may be formed using the third mask film MASK3. The via contact trench 195*t* may be formed by removing the second interlayer insulating film 192 and the upper stop film 191. The via contact trench 195*t* may expose a portion of the upper surface of the active contact 170.

Referring to FIG. 20, the via contact 195 may be formed in the via contact trench 195*t*. First, a via contact barrier film 195*a* may be formed along a sidewall and a bottom surface of the via contact trench 195*t*. Subsequently, a via contact filling film 195*b* may be formed on the via contact barrier film 195*a*.

The via contact barrier film 195*a* may include, for example, at least one of tantalum (Ta), tantalum nitride (TaN), titanium (Ti), titanium nitride (TiN), titanium silicon nitride (TiSiN), ruthenium (Ru), cobalt (Co), nickel (Ni), nickel boron (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), rhodium (Rh) and/or a two-dimensional (2D) material. In an integrated circuit device according to some embodiments of the present inventive concept, the two-dimensional material may be a metallic material and/or a semiconductor material. The two-dimensional material may include two-dimensional allotrope or two-dimensional compound. For example, the two-dimensional material may include at least one of graphene, molybdenum disulfide ($MoS_2$), molybdenum diselenide ($MoSe_2$), tungsten diselenide ($WSe_2$), and tungsten disulfide ($WS_2$). However, the present inventive concept is not limited thereto. For example, the above-described two-dimensional materials are only listed by way of example. The two-dimensional materials that may be included in the integrated circuit device, according to an embodiment of the present inventive concept, are not limited to the above-mentioned materials.

The via contact filling film 195*b* may include, for example, at least one of aluminum (Al), tungsten (W), cobalt (Co), ruthenium (Ru), silver (Ag), gold (Au), manganese (Mn), and/or molybdenum (Mo).

As described above, the first pattern may be formed using the first layer L1. The first pattern may be, for example, the active contact 170. Subsequently, the second pattern may be formed using the second layer L2. The second pattern may be, for example, the gate contact 180. Subsequently, the third pattern may be formed using the third layer L3. The third pattern may be the via contact 195, for example.

In the integrated circuit layout according to some embodiments of the present inventive concept, the design rule of the pattern formed in the mark area complies with that of the pattern formed in the main area. Accordingly, when the integrated circuit device is manufactured using the integrated circuit layout according to some embodiments of the present inventive concept, the reliability of the integrated circuit device may be increased.

While the present inventive concept has been described with reference to exemplary embodiments thereof, it will be understood by those of ordinary skill in the art that various changes in form and details may be made thereto without departing from the spirit and scope of the present inventive concept.

What is claimed is:

1. An integrated circuit layout comprising:

a first chip area; and a second chip area adjacent to the first chip area, wherein the first chip area includes:

a first main area in which a first main pattern is formed;

a first mark area adjacent to the first main area, wherein a first mark pattern is formed in the first mark area; and a first dummy area in which a first dummy pattern is formed, wherein the first dummy area is outside of the first main area and the first mark area, wherein the second chip area includes:

a second main area in which a second main pattern is formed;

a second mark area adjacent to the second main area, wherein a second mark pattern is formed in the second mark area; and a second dummy area in which a second dummy pattern is formed, wherein the second dummy area is outside of the second main area and the second mark area, wherein the first and second mark patterns are used to check alignment states of the first chip area and the second chip area, respectively, and wherein each of the first and second mark patterns has a standard cell structure.

2. The integrated circuit layout of claim 1, wherein a design rule of the first mark pattern complies with a design rule of the first main pattern.

3. The integrated circuit layout of claim 2, wherein a design rule of the second mark pattern complies with a design rule of the second main pattern.

4. The integrated circuit layout of claim 1, wherein a relative position of the first mark area with respect to the first main area is identical to a relative position of the second mark area with respect to the second main area.

5. The integrated circuit layout of claim 1, wherein the first chip area includes a first layer and a second layer disposed on the first layer.

6. The integrated circuit layout of claim 5, wherein each of the first layer and the second layer includes the first main area and the first mark area, wherein the first mark area of the first layer and the first mark area of the second layer overlap each other.

7. The integrated circuit layout of claim 1, wherein the first main pattern includes first sub-main patterns arranged with a first pitch, wherein the first mark pattern includes first sub-mark patterns arranged with a second pitch, wherein the first pitch and the second pitch are equal to each other.

8. The integrated circuit layout of claim 7, wherein the second main pattern includes second sub-main patterns arranged with a third pitch, wherein the second mark pattern includes second sub-mark patterns arranged with a fourth pitch, wherein the third pitch and the fourth pitch are equal to each other.

9. An integrated circuit layout comprising:

a first layer; and a second layer disposed on the first layer, wherein the first layer includes:

at least one first main area, wherein a first main pattern is formed in each of the at least one first main area; and at least one first mark area adjacent to the at least one first main area, wherein a first mark pattern is for checking an alignment state of the first main area and is formed in each of the at least one first mark area, wherein the second layer includes:

at least one second main area, wherein a second main pattern is formed in each of the at least one second main area; and at least one second mark area adjacent to the at least one second main area, wherein a second mark pattern is for checking an alignment state of the second main area and is formed in each of the at least one second mark area, wherein the first main area and the second main area overlap each other, wherein the first mark area and the second mark area overlap each other, and wherein each of the first and second mark patterns has a standard cell structure.

10. The integrated circuit layout of claim 9, wherein the first layer includes a first chip area and a second chip area adjacent to each other, wherein the first mark pattern is used to check an alignment state of each of the first chip area and the second chip area.

11. The integrated circuit layout of claim 10, wherein each of the first chip area and the second chip area includes the at least one first main area and the at least one first mark area, wherein a relative position of the first mark area with respect to the first main area in the first chip area is identical to a relative position of the first mark area with respect to the first main area in the second chip area.

12. The integrated circuit layout of claim 9, wherein a design rule of the first mark pattern complies with a design rule of the first main pattern.

13. The integrated circuit layout of claim 12, wherein a design rule of the second mark pattern complies with a design rule of the second main pattern.

14. The integrated circuit layout of claim 9, wherein the first main pattern includes first sub-main patterns arranged with a first pitch, wherein the first mark pattern includes first sub-mark patterns arranged with a second pitch, wherein the first pitch and the second pitch are equal to each other.

15. The integrated circuit layout of claim 14, wherein the second main pattern includes second sub-main patterns arranged with a third pitch, wherein the second mark pattern includes second sub-mark patterns arranged with a fourth pitch, wherein the third pitch and the fourth pitch are equal to each other.

* * * * *